United States Patent
Nishi

(10) Patent No.: US 6,654,095 B1
(45) Date of Patent: Nov. 25, 2003

(54) EXPOSURE APPARATUS, EXPOSURE METHOD, AND DEVICE MANUFACTURING METHOD

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/690,729

(22) Filed: Oct. 18, 2000

(30) Foreign Application Priority Data

Oct. 18, 1999 (JP) ............................................. 11-294864

(51) Int. Cl.$^7$ ........................ G03B 27/52; G03B 27/42; G03B 27/54; A61N 5/00; G03C 5/00

(52) U.S. Cl. ............................. 355/30; 355/53; 355/55; 355/67; 250/492.2; 250/492.22; 430/311; 430/312

(58) Field of Search ............................... 355/30, 53, 55, 355/67; 250/492.2, 492.22; 430/311, 312

(56) References Cited

U.S. PATENT DOCUMENTS

| | | | |
|---|---|---|---|
| 4,690,528 A | | 9/1987 | Tanimoto et al. |
| 4,998,821 A | | 3/1991 | Ohta et al. |
| 5,425,045 A | | 6/1995 | Hamatani |
| 5,430,303 A | | 7/1995 | Matsumoto et al. |
| 5,559,584 A | | 9/1996 | Miyaji et al. |
| 5,696,623 A | * | 12/1997 | Fujie et al. |
| 6,208,406 B1 | | 3/2001 | Nakashima |
| 6,222,610 B1 | | 4/2001 | Hagiwara et al. |
| 6,335,787 B1 | | 1/2002 | Nishi |

FOREIGN PATENT DOCUMENTS

| | | |
|---|---|---|
| JP | 61-079228 | 4/1986 |
| JP | 62-286226 | 12/1987 |
| JP | 4-136943 | 5/1992 |
| JP | 9-162117 | 6/1997 |
| JP | 9-246140 | 9/1997 |
| JP | 10-284410 | 10/1998 |
| JP | WO99/25010 | 5/1999 |
| JP | WO00/48237 | 8/2000 |

OTHER PUBLICATIONS

US 2002/0033934 A1, Hiroyuki Ishii; Projection Exposure Apparatus and Device Manufacturing Method; Mar. 21, 2002.

* cited by examiner

Primary Examiner—Russell Adams
Assistant Examiner—Khaled Brown
(74) Attorney, Agent, or Firm—Oblon, Spivak, McClelland, Maier & Neustadt, P.C.

(57) ABSTRACT

The apparatus comprises the first air conditioning room which includes the edge surface of the image plane side of the projection optical system and the substrate stage and its driving unit, the second air conditioning room which includes the edge surface of the object surface side of the projection optical system and the mask stage and its driving unit, the third air conditioning room which includes the projection optical system, and the fourth air conditioning room which includes the illumination optical system. It also comprises the first air conditioning control unit, which supplies helium gas of a moderate level to the first and second air conditioning rooms, and the second air conditioning control unit, which supplies helium gas with a high purity level to the third and fourth air conditioning rooms. Accordingly, the first and second air conditioning control units independently control the airflow and the contamination of the respective rooms by using gases for air conditioning corresponding to the performance required. Thus, various ideal controls can be performed independently.

37 Claims, 14 Drawing Sheets

EXPOSURE APPARATUS, EXPOSURE METHOD, AND DEVICE MANUFACTURING METHOD

BACKGROUND OF THE INVENTION

1. Field of the Invention

The present invention relates to an exposure apparatus, a making method of the exposure apparatus, and a device manufacturing method. More particularly, the present invention relates to an exposure apparatus and the method of making the apparatus used in lithographic process, to transfer a pattern formed on a mask onto a substrate when manufacturing devices such as a semiconductor device, a pick up device (such as a CCD), a liquid crystal display device, and a thin-film magnetic head device. The present invention shows a superb effect, when applied to an exposure apparatus using vacuum ultraviolet light as an illumination light for exposure.

2. Description of the Related Art

In the case of manufacturing devices such as semiconductors, as an exposure apparatus to transfer a pattern formed on a reticle as a mask onto each shot area of a wafer being coated with a photoresist, conventionally, a step-and repeat-type (a static exposure type) reduction projection type exposure apparatus (a stepper) was often used. Whereas, in recent years, to cope with the demand of a larger transfer pattern subject to exposure without imposing a heavy burden on the projection optical system, a projection exposure apparatus based on a step-and-scan method, that is, a scanning stepper is gathering attention. The scanning stepper sequentially transfers a reduced image on the reticle, by synchronously scanning the reticle and the wafer in respect to the projection optical system in a state where the pattern formed on the reticle is partially projected on the wafer via the projection optical system as a reduced image. This scanning stepper is an exposure apparatus developed by combining the advantage of a transfer method (the slit-scan method) of an aligner, which transfers the entire pattern formed on the reticle by equal magnification on one scanning exposure, and the advantage of the transfer method of the stepper.

Also, with the projection exposure apparatus in general, higher resolution is required. A method of increasing the resolution is to use an illumination light for exposure, which has a shorter wavelength. With the conventional exposure apparatus, an emission line (g line or i line) in the ultraviolet range emitted by an ultra-high pressure mercury lamp has been used. However, recently, light in the deep ultraviolet light region or the vacuum ultraviolet light region such as the KrF excimer laser beam (wavelength: 248 nm) or the ArF excimer laser beam (wavelength: 193 nm) is being used. In addition, the use of a metal vapor laser beam or a harmonic of a YAG laser beam is being considered.

Meanwhile, in the case of using an ultraviolet light such as an excimer light as the illumination light for exposure, the necessity of circulating nitrogen ($N_2$) gas or a gas with ozone removed (such as air) was pointed out. This was due to the fact that the ultraviolet light is absorbed by ozone, as well as in consideration of the properties of the photoresist. However, simply replacing the entire gas within the chamber where the projection optical system is arranged to gas such as nitrogen gas, may cause nitrogen gas with high concentration to leak out, when a worker opens the door of the chamber during maintenance operation by accident.

In order to improve such inconvenience, details of a projection exposure apparatus is disclosed in Japanese Patent Laid Open No. 09-246140, that uses a laser light source emitting a beam having a wavelength range equal to or shorter than the ultraviolet region; houses the illumination optical system, projection optical system, the reticle stage, and the substrate stage separately in a plurality of independent casings; and has a gas supplying means to at least one of the plurality of casings to supply multiple types of gases in the cases with a switching operation. With this projection exposure apparatus, a low absorptive gas to the illumination light for exposure is supplied in the selected casing when usual exposure is performed, whereas in cases when pilot exposure is performed during maintenance gas such as air, which is safe for the worker, is supplied. This allows prevention of the leakage of nitrogen with high concentration almost without fail, and provided the advantage of simplifying the maintenance operation.

As the degree of integration for semiconductor devices become more and more demanding each year, a requirement for improving the resolution of the exposure apparatus have surfaced. For this reason, the KrF excimer laser beam or the ArF excimer laser beam is no longer sufficient enough as the illumination light for exposure. Therefore, possibilities of using a light with a shorter wavelength such as the $F_2$ laser beam (wavelength: 157 nm) or a vacuum ultraviolet light with a shorter wavelength as the illumination light for exposure are being seriously explored. Thus, it is safely said that the $F_2$ laser exposure apparatus is a prime possibility of the exposure apparatus of the next generation.

With the projection exposure apparatus referred to the disclosure above, however, as a premise, the KrF excimer laser beam or the ArF excimer laser beam is used as the illumination light for exposure. Accordingly, two types out of three gases being nitrogen, ozone-depleted air, and air, are used by switching operation.

Also, with the projection exposure apparatus referred to the disclosure above, nitrogen with a low purity level is exhausted to the external atmosphere.

Meanwhile, in the case of using the $F_2$ laser beam or the vacuum ultraviolet light having a wavelength shorter than the $F_2$ laser beam, vacuum ultraviolet light is absorbed by gases such as oxygen, vapor, and hydrocarbon gas on the optical path. And this makes it difficult to secure the sufficient transmittance to the laser beam. Therefore, a possibility can be considered to remove the gases above from the optical path of the laser beam by replacing it with helium gas.

Helium gas, however, is costly, compared with nitrogen gas, therefore; simply replacing nitrogen with helium gas in the disclosure above only increases the cost of the apparatus. Also, when using the $F_2$ laser beam, the degree of chemical cleanliness of the optical path needs to be maintained at a tighter level compared with the case of using ArF excimer laser beam. So, from this point as well, it is not sufficient enough to employ the disclosure above without any modification.

SUMMARY OF THE INVENTION

The present invention has been made in consideration of the inconvenience of the prior art, and has as its first object to provide a new exposure method and an exposure apparatus that exhibits high performance in the aspects of the degree of chemical cleanliness and the transmittance to the illumination light for exposure.

It is the second object of the present invent ion to provide a device manufacturing method that can improve the productivity when producing highly integrated microdevices.

According to the first aspect of the present invention, there is provided an exposure apparatus which performs exposure on a substrate with an illumination light from a light source, the exposure apparatus comprising: at least a first type air conditioning room arranged on an optical path between the light source and the substrate, the first type air conditioning room having a short optical path of the illumination light passing through and a predetermined level of chemical cleanliness degree; at least a second type air conditioning room arranged on the optical path, the second type air conditioning room having a longer optical path of the illumination light passing through and a higher degree of chemical cleanliness compared with the first type air conditioning room; a first air conditioning control unit which supplies a first gas to air condition the first type air conditioning room; and a second air conditioning control unit which supplies a second gas to air condition the second type air conditioning room.

Air conditioning, here, means in general, conditioning the air, that is automatically adjusting the temperature or the humidity of the air inside a room so as to maintain the best condition. However, in this description, "air conditioning" means not only to condition the air, but also means to send gas into the room so as to maintain the condition of the room at a desired state, likewise with the air conditioning in general.

With the exposure apparatus in the present invention, in the second type air conditioning room, the gaseous portion in which the illumination light (illumination light flux) passes through is long, and require a high degree of chemical cleanliness. Therefore, air conditioning is to be performed with the illumination light kept from being absorbed as much as possible, as well as with a high degree of chemical cleanliness. Meanwhile, in the first type air conditioning room, the distance that the illumination light passes through is short, and the degree of chemical cleanliness is not so high compared with the second type air conditioning room. Therefore, the amount of illumination light absorbed while passing through the gaseous portion is small, therefore the air conditioning require a degree of chemical cleanliness to only some extent. In short, the performance required for air conditioning differs between the first type air conditioning room and the second type air conditioning room.

Therefore, with the exposure apparatus in the present invention, the first air conditioning control unit supplies the first gas to air condition the first air conditioning control unit; and the second air conditioning control unit supplies the second gas to air condition the second type air conditioning room. This allows the first air conditioning control unit and the second air conditioning control unit to independently control the air flow and the contamination by using gases for air conditioning in accordance to the performance required, thus can perform various ideal controls independently. Accordingly, by arranging the optical system in the first air conditioning control unit and by arranging the mask or substrate which do not like dust in the second air conditioning control unit, the transmittance of the optical system can be kept from deteriorating and dust from adhering. Also, the degree of chemical cleanliness respectively required can be easily achieved.

In this case, the second gas can be an inert gas with high purity level, and the first gas can be an inert gas which purity level is lower than the second gas.

With the exposure apparatus in the present invention, the exposure apparatus can further comprise: a third type air conditioning room which houses the first type air conditioning room and the second type air conditioning room; and a third air conditioning control unit which supplies a third gas to air condition the third type air conditioning room. That is, outside the first type air conditioning room and the second type air conditioning room, the third type air conditioning room can be arranged which houses the first type air conditioning room and the second type air conditioning room. And the third air conditioning control unit which supplies a third gas to air condition the third type air conditioning room is also arranged, thus making up a double-structured air conditioning room.

In this case, the second gas used to air condition the second type air conditioning room can be an inert gas with high purity level, and the first gas used to air condition the first type air conditioning room can be an inert gas which purity level is lower than the second gas, and the third gas can be a gas including the inert gas which purity level is lower than that of the first gas.

With the exposure apparatus in the present invention, the exposure apparatus can comprise a main body of the exposure apparatus, which includes an illumination optical system illuminating the mask with the illumination light, a mask stage which holds the mask, a projection optical system projecting the illumination light outgoing from the mask to the substrate, and a substrate stage which holds the substrate, and the first type air conditioning room is at least one of a first air conditioning room which include an edge surface of an image plane side of the projection optical system, the substrate stage and its driving unit, and a second air conditioning room which include an edge surface of an object surface side of the projection optical system, the mask stage and its driving unit, and the second type air conditioning room is at least one of a third air conditioning room which include the projection optical system and a fourth air conditioning room which include the illumination optical system.

In general, in the third air conditioning room and fourth air conditioning room where the optical system is installed, the gaseous portion where the illumination light flux passes through is long, and the absorption of the illumination light has to be suppressed to an extreme as well as require a chemically clean air conditioning. Whereas, in the first air conditioning room and second air conditioning room where the stage system is installed, the gaseous portion where the illumination light flux passes through is short so the amount of illumination light absorbed is small. Therefore, for example, in the case of measuring the stage position using the interferometer, the degree of chemical cleanliness required is a degree that does not affect the measurement precision. However, with the first air conditioning room and second air conditioning room, in order to prevent dust from depositing on the mask, an air flow needs to be generated to some extent. As can be seen, the performance required for air conditioning differs between the first air conditioning room, second air conditioning room and the third air conditioning room, fourth air conditioning room.

With the present invention, the first air conditioning control unit provides the first gas to at least either the first or second air conditioning room. And the second air conditioning control unit provides the second gas to at least either the third or fourth air conditioning room. This allows the first air conditioning control unit and the second air conditioning control unit to independently control the air flow and the contamination by using gases for air conditioning in accordance to the performance required, thus can perform various ideal controls independently. Accordingly, the transmittance of the optical system can be kept from deteriorating and dust from adhering.

In this case, the second gas can be an inert gas with high purity level, and the first gas can be an inert gas which purity level is lower than the second gas. The second gas is the gas supplied to the space in the optical system of the illumination optical system and of the projection optical system, therefore, an inert gas with a high purity level is required so as to keep the contamination level from deteriorating by air conditioning. Whereas, with the stage portion where the maintenance frequency or substrate mask exchanging frequency is high, usage of chemical filters to remove contamination is required, however, the first gas supplied to the stage portion need only the purity level so that it does not affect the measurement accuracy of the interferometer, and does not need to be higher.

With the exposure apparatus in the present invention, the exposure apparatus can further comprise: a stage control unit which drives at least one of the substrate stage and the mask stage housed in the first type air conditioning room, when the first air conditioning control unit supplies the first gas to air condition the first type air conditioning room and replaces internal gas.

In such a case, when replacing the gas within the first type air conditioning room (either one of the first air conditioning room and the second air conditioning room) where the frequency of maintenance is high, the stage control unit drives either the substrate stage or the mask stage which is the specific stage while replacing the gas, therefore, by driving the stage the gas is more positively dispersed, which allows a higher gas replacement speed.

With the exposure apparatus in the present invention, the second air conditioning control unit can operate by a secondary power supply, the second air conditioning control unit starts to operate by the secondary power supply to stop the internal gas of the second type air conditioning room from flowing out as well as to supply an extremely small amount of the second gas when a main power supply of the exposure apparatus is cut off. In such a case, in the projection optical system and the illumination optical system where the maintenance frequency is originally low and does not have many driving portions, the purged state of the second gas can be maintained at all times. Therefore, when starting up the operation of the apparatus, the frequency of having to create a vacuumed state greatly decreases, and this in turn relieves the apparatus from unnecessary stress, as well as reduce the start up time.

With the exposure apparatus in the present invention, partial air conditioning which uses the second gas can be performed in parallel with total air conditioning which uses the first gas in the second type air conditioning room on exposure.

In this case, the second type air conditioning room can have a path which guides the second gas to a specific area inside the second type air conditioning room.

With the exposure apparatus in the present invention, the first type air conditioning room can have the first air conditioning room and the second air conditioning room, and the second type air conditioning room can have the third air conditioning room and the fourth air conditioning room. In such a case, the optical path of the illumination light from the illumination optical system to the substrate is air conditioned by using the first gas or the second gas. With this arrangement, the transmittance of the optical system can be kept from deteriorating, and dust and small particles can also be kept from adhering onto the optical system without fail.

In this case, the first air conditioning room and the third air conditioning room, the third air conditioning room and the second air conditioning room, and the second air conditioning room and the fourth air conditioning room can be respectively divided by a sheet member. In such a case, the adjacent air conditioning rooms are divided by the sheet member, therefore, gases can be replaced with the atmosphere independently, and the work efficiency during maintenance operation is greatly improved. In this case, from the viewpoint of suppressing the degree of chemical cleanliness from decreasing in each chamber, it is preferable for the sheet member to have gone through a chemically cleaned process.

In this case, the sheet member can be a pressure resistant sheet which surface is at least, chemically processed. In such a case, the adjacent air conditioning rooms are divided by the sheet member which is a pressure resistant sheet which surface is at least chemically processed, therefore, the degree of chemical cleanliness decreasing can be suppressed in each chamber. And, also, when replacing the gas in each chamber, gas can be effectively replaced by creating a vacuumed state in each chamber to exhaust the interior gas, and then supplying the inert gas to each chamber.

Alternatively, the sheet member may comprise metal leaf. In such a case, the sheet member which comprises metal leaf can further effectively suppress the vibration from travelling. The sheet member may also be a sheet member made of soft plastic with metal vaporized.

With the exposure apparatus in the present invention, the main body of the exposure apparatus can movably support the substrate stage as well as support the projection optical system, the main body comprising: a first unit supported by a vibration isolation mechanism; and a second unit independent from the first unit in respect to vibration, the second unit supporting a driving unit of the substrate stage; and the sheet member is deformed in accordance with a relative positional change between the first unit and the second unit. In such a case, the sheet member which divides the adjacent air conditioning rooms is deformed in accordance with a relative positional change between the first unit and the second unit, therefore, the sheet member does not interfere the positional change occurring between the first unit and the second unit so vibration does not travel in between the first unit and the second unit. Accordingly, the vibration of the second unit side which supports the driving unit of the substrate stage can be kept from being the cause of vibration occurring in the first unit side which supports the projection optical system, as well as divide each air conditioning rooms with the sheet members.

In this case, the first unit can also movably support the mask stage; and the second unit can also support a driving unit of the mask stage.

With the exposure apparatus in the present invention, in the case the exposure apparatus comprises the first unit and the second unit, the sheet member can be fastened to each unit by a fastening mechanism, the fastening mechanism fastens the sheet members in a state where the sheet member is clamped between two members which surface roughness is below a predetermined level, and the fastening mechanism can be unfastened. In such a case, the sheet member is fastened to the first unit and the second unit via two members (for example spacers) which surface roughness is below the predetermined level and is arranged on the inner surface and outer surface of the sheet member by a fastening mechanism. By fastening the sheet member and each unit so that they are in close contact, gas contamination can be prevented. And compared with the case when the dividing material is made of a rigid material, downsizing is possible.

Also, the fastening mechanism can be easily resolved, therefore, compared with the case when the dividing material is fixed, work efficiency during maintenance operation can be improved.

With the exposure apparatus in the present invention, in the case the exposure apparatus comprises the first air conditioning room and the second air conditioning room as the first type air conditioning room and the third air conditioning room and the fourth air conditioning room as the second type air conditioning room, the second gas used to air condition the third air conditioning room and the fourth air conditioning room can be an inert gas with high purity level, and the first gas used to air condition the first air conditioning room and the second air conditioning room can be an inert gas which purity level is lower than the second gas.

In this case, the inert gas may be nitrogen, neon, argon, krypton, xenon, or it may be helium gas.

With the exposure apparatus in the present invention, in the case the third air conditioning room and the fourth air conditioning room is air conditioned with the inert gas with high purity level (the second gas), and the first air conditioning room and the second air conditioning room is air conditioned with the inert gas which purity level is lower than the second gas (the first gas), the exposure apparatus can comprise: a fifth air conditioning room including the first to fourth air conditioning rooms; and a third air conditioning control unit which air conditions the fifth air conditioning room.

In this case, the exposure apparatus can further comprise: a first concentration sensor which individually detects concentration of the inert gas in a gas respectively used to air condition the first to fourth air conditioning rooms; and a first monitoring unit which monitors the concentration of the inert gas in the gas respectively used to air condition the first to fourth air conditioning rooms in accordance with an output of the first concentration sensor; wherein when the concentration of the inert gas of the gas used to air condition at least one of the first and second air conditioning rooms, which is a first specific air conditioning room, is detected to have fallen below a predetermined concentration by the first monitoring unit, the first air conditioning control unit freshly supplies the first gas to the first specific air conditioning room, while exhausting the gas used to air condition the first specific air conditioning room to the third air conditioning control unit so as to use the gas to air condition the fifth air conditioning room, and when the concentration of the inert gas of the gas used to air condition at least one of the third and fourth air conditioning rooms, which is a second specific air conditioning room, is detected to have fallen below a predetermined concentration by the first monitoring unit, the second air conditioning control unit freshly supplies the second gas to the second specific air conditioning room, while exhausting the gas used to air condition the second specific air conditioning room to the third air conditioning control unit so as to use the gas to air condition the fifth air conditioning room.

In such a case, when the concentration of the inert gas of the gas used to air condition at least one of the first and second air conditioning rooms, which is the first specific air conditioning room, falls below the threshold value, the decline in the concentration is detected by the first monitoring unit in accordance with the output of the first concentration sensor. When the decline is detected, the first air conditioning control unit newly supplies the first gas into the first specific air conditioning room, as well as exhaust the gas used to air condition the first specific air conditioning room to the third air conditioning control unit so that the gas can be used to air condition the fifth air conditioning room. Meanwhile, when the concentration of the inert gas of the gas used to air condition at least one of the third and fourth air conditioning rooms, which is the second specific air conditioning room, falls below the threshold value, the decline in the concentration is detected by the first monitoring unit in accordance with the output of the first concentration sensor. And when the decline is detected, the second air conditioning control unit newly supplies the second gas into the second specific air conditioning room, as well as exhaust the gas used to air condition the second specific air conditioning room to the third air conditioning control unit so that the gas can be used to air condition the fifth air conditioning room. Thus, the third air conditioning control unit uses the exhausted gas to air condition the fifth air conditioning room.

Originally, the gas within the first to fourth air conditioning rooms needs to be replaced with an inert gas with a high purity (the purity level of the inert gas of the first gas supplied to the first and second air conditioning rooms may be lower than the second gas supplied to the third and fourth air conditioning rooms, but requires a purity to some extent) and if the purity level declines it cannot be used as it is. However, as is with the present invention, in the case the gas which purity level has declined is supplied to the fifth air conditioning room (total air conditioning room) that include the first to fourth air conditioning rooms, even if the pressure in the interior of the first to fourth air conditioning rooms is not positive, the gas which may flow into the first to fourth air conditioning rooms by a small amount is the inert gas, therefore, compared with the case of performing total air conditioning with $N_2$ or dry air the speed of the purity of the inert gas in the first to fourth air conditioning rooms deteriorating can be greatly slowed down. That is, the space filled with the inert gas can be formed of a double-structure, and this allows the amount of the inert gas supplied to the air conditioning rooms to be suppressed.

In this case, the first concentration sensor can include at least one of an impurities concentration sensor and an ozone sensor. In such a case, when the measurement value of the first concentration sensor exceeds a predetermined permissive value, it can be detected that the concentration of the inert gas within the gas used to air condition the first to fourth air conditioning rooms has fallen below the predetermined concentration value.

With the exposure apparatus in the present invention, the exposure apparatus can further comprise: a storing mechanism which stores gas used for air conditioning for recycling; a second concentration sensor which detects concentration of the inert gas in gas used to air condition the fifth air conditioning room; and a second monitoring unit which monitors the concentration of the inert gas in the gas used to air condition the fifth air conditioning room; wherein when the second monitoring unit detects that the concentration of the inert gas in the gas has fallen below a predetermined concentration, the third air conditioning control unit can exhaust the gas used to air condition the fifth air conditioning room into the storing mechanism. In such a case, gas which purity level of inert gas declined, used to air condition the first to fourth air conditioning rooms, is sent to the fifth air conditioning room. This gas is used to air condition the fifth air conditioning room, and when the purity level of the gas falls below the predetermined concentration, this decline is detected by the second monitoring unit in accordance with the output of the second concentration sensor. When the decline is detected, then the third air conditioning control unit exhausts the gas used to air condition the fifth air conditioning room to the storing mechanism. As is described, the gas that has been used to air condition the rooms which purity has declined, is not exhausted externally, and is stored in the storing mechanism, therefore, polluting the environment can be avoided, as well as the worker from inhaling the gas. Also, since the gas stored in the storing mechanism is recycled, it leads to cutting the cost.

In this case, the second concentration sensor can include at least one of an impurities concentration sensor and an ozone sensor. In such a case, when the measurement value of the second concentration sensor exceeds a predetermined permissive value, it can be detected that the concentration of the inert gas within the gas used to air condition the fifth air conditioning room has fallen below the predetermined concentration value.

According to the second aspect of the present invention, there is provided an exposure method to perform exposure on a substrate with illumination light from a light source, the exposure method comprising; providing a first gas to a first space which is arranged on an optical path between the light source and the substrate, the space having a short optical path of the illumination light passing through and a predetermined level of chemical cleanliness degree; providing a second gas to a second space which has a longer optical path of the illumination light passing through compared with the first space; and performing exposure on the substrate with the illumination light from the light source after the first space is filled with the first gas and the second space is filled with the second gas.

In this case, the second gas can be an inert gas with high purity level, and the first gas can be an inert gas which purity level is lower than the second gas.

In this case, a third space may house the first space and the second space, and a third gas may be supplied to the third space.

In this case, the third gas can be an inert gas which purity level is lower than that of the first gas.

In this case, a stage which holds the substrate can be housed in the first space, and an optical system to perform exposure on the substrate with the illumination light can be housed in the second space.

Also, by using the exposure apparatus or the exposure method according to the present invention in the lithographic process, the pattern can be accurately formed on the substrate, and as a consequence, can manufacture microdevices having a higher integration with higher yield. Therefore, according to the third aspect of the present invention, there is provided a device manufacturing method, which uses the exposure apparatus or the exposure method of the present invention.

DESCRIPTION OF THE PREFERRED EMBODIMENTS

Figure 1:
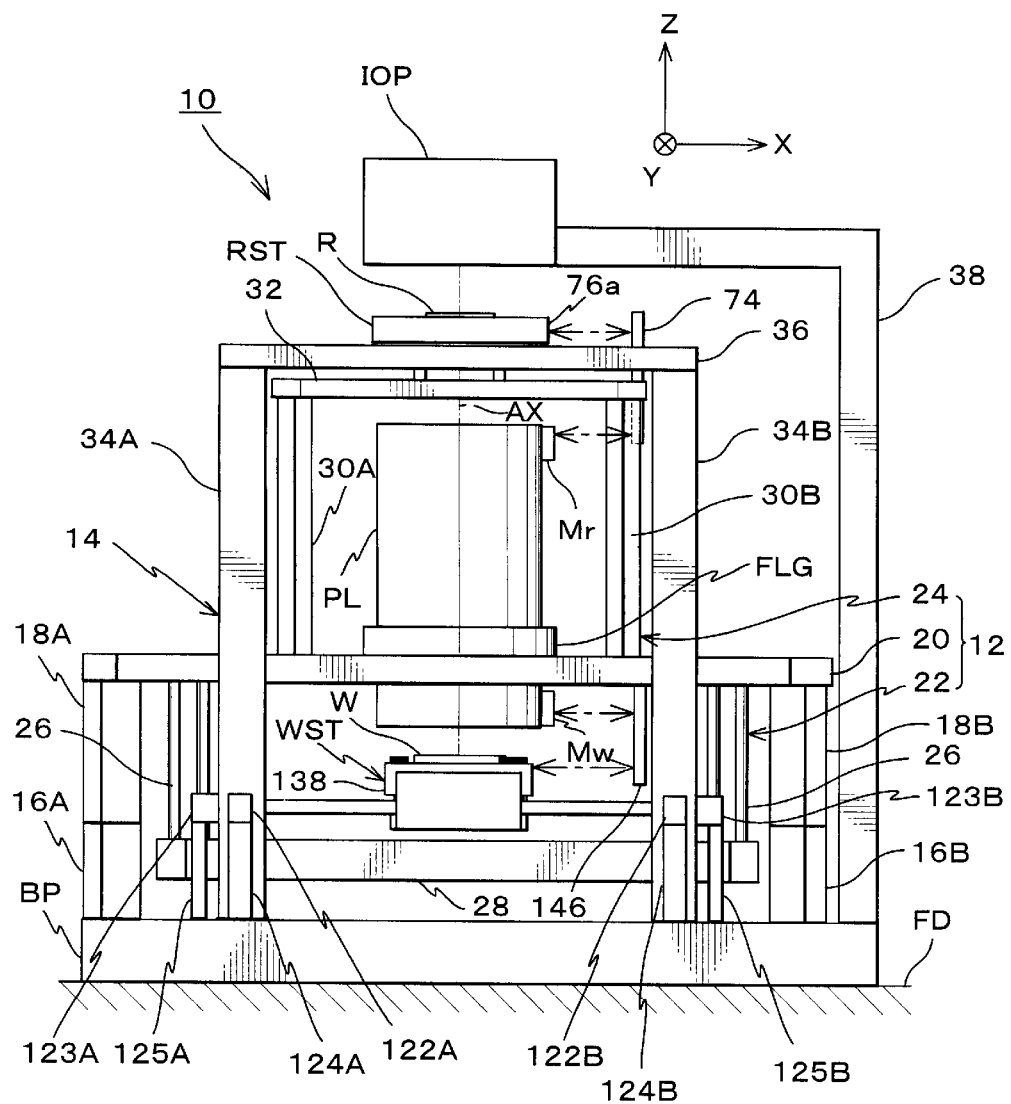
FIG. 1 is a schematic view showing the configuration of the exposure apparatus of the embodiment in the present invention.

An embodiment of the present invention will be described below with reference to FIGS. 1 to 12. FIG. 1 shows the schematic arrangement of a scanning exposure apparatus 10 according to the embodiment. The exposure apparatus 10 is a scanning exposure apparatus based on a step-and-scan method, that is, a so-called scanning stepper. With this apparatus, the reticle serving as a mask and a wafer serving as a substrate are synchronously moved in a linear direction (in this case, in the Y-axis direction being perpendicular to the direction of the paper as in FIG. 1). And, the pattern formed on the reticle R is transferred onto each shot area of on the wafer W via the projection optical system PL.

The exposure apparatus 10 comprises: an illumination optical system IPO, which illuminates the reticle R with an illumination light from the light source (not shown in Figures); a reticle stage RST serving as a mask stage, which holds the reticle R; a projection optical system PL, which projects the illumination light emerging from the reticle R onto the wafer W; a wafer stage WST serving as a substrate stage, which holds the wafer W; a main column 12 serving as a first unit, which movably supports the reticle stage RST and the wafer stage WST as well as hold the projection optical system; and the second unit 14, which supports the driving units of the reticle stage RST and the wafer stage WST, and the like. The driving unit of the reticle stage RST and the like are omitted in FIG. 1.

Figure 4:
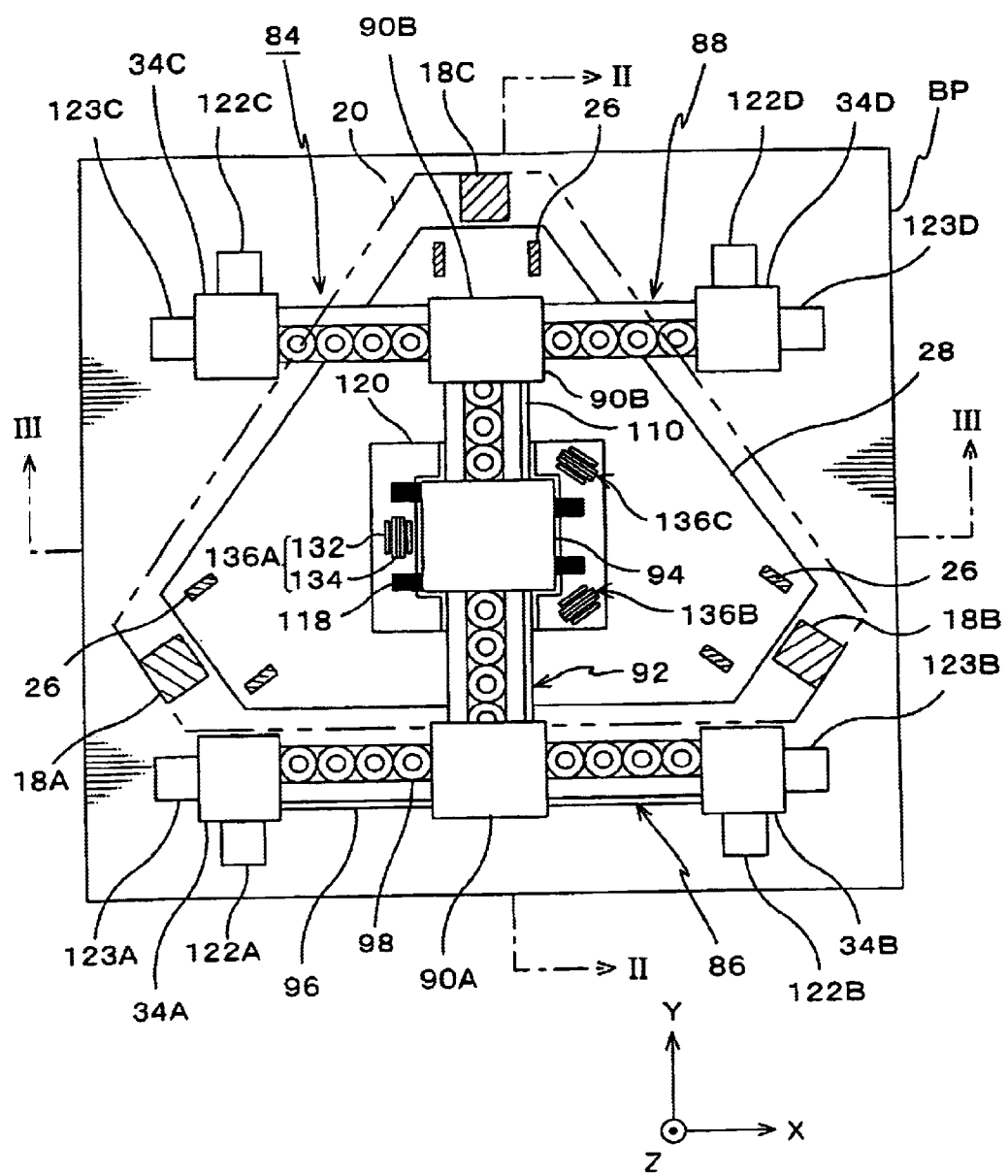
FIG. 4 is a planar view showing the arrangement in the vicinity of the driving unit which drives the wafer stage in the XY two dimensional direction.

The main column 12 comprises: a barrel supporting bed 20 (a triangular shape in a planar view) which is substantially supported horizontally via vibration isolation units 18A, 18B, and 18C (the vibration isolation unit 18C located in the depth of field of the drawing is not shown in FIG. 1, refer to FIG. 4), a suspended column 22 suspended down from the lower surface of the bed 20, and a supporting column 24 arranged on the bed 20. The vibration isolation units serve as a vibration isolation mechanism, and are respectively arranged on the upper surface of a plurality (three, in this case) of body supporting members 16A, 16B, and 16C (the body supporting member 16C located in the depth of field of the drawing is not shown in the FIG.). And the body supporting members are arranged on a base plate BP referred to as a frame caster which is the base of the apparatus arranged horizontally on the floor FD of the clean room.

The vibration isolation units 18A, 18B, and 18C, are respectively are arranged in series (or in parallel) on top of the body supporting members 16A, 16B, and 16C, and are each made up of an air mount which the internal pressure is adjustable and a voice coil motor. These vibration isolation units 18A to 18C isolate subtle vibration travelling from the floor surface FD to the bed 20 via the base plate BP and the body supporting members 16A to 16C, at a micro-G level.

The suspended column 22 is structured of a supporting bed suspending member 26 and a wafer base supporting bed 28. The supporting bed suspending member 26 has a total of 6 suspended members, two each suspending from the lower surface of the bed 20 at a position in the vicinity of the apexes of the triangle, on the inner side of the vibration isolation units 18A, 18B, and 18C. And these 6 supporting bed suspending members 26 support the wafer base supporting bed 28 (refer to FIG. 4), which is also a triangular shape (being a triangular shape one size smaller than the bed 20) in a planar view, by suspension in the vicinity of the apexes.

Figure 2:
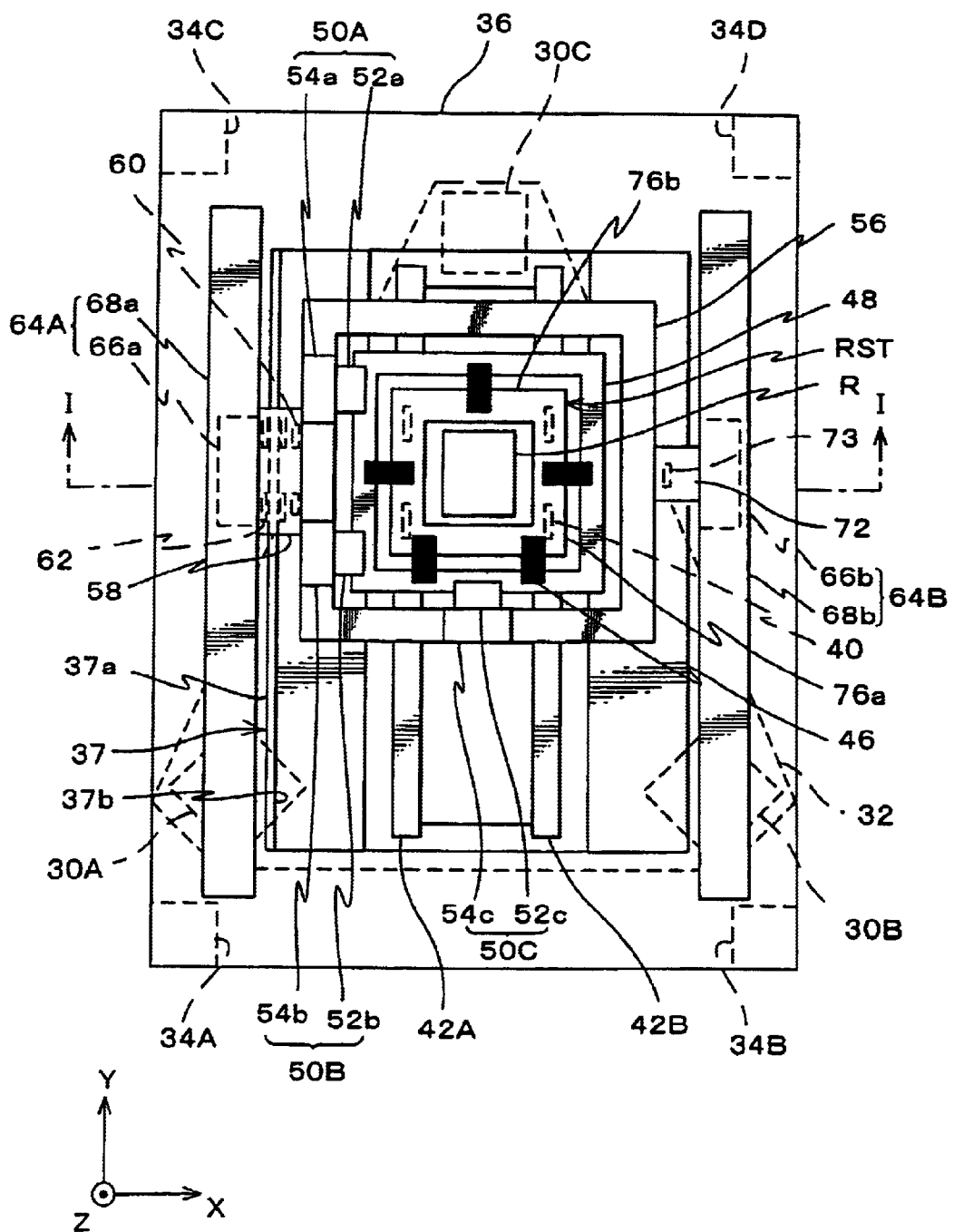
FIG. 2 is a planar view schematically showing the reticle stage and the driving unit of the apparatus in FIG. 1.

The supporting column 24 has three legs 30A, 30B, and 30C (the leg 30C located in the depth of field of the drawing is not shown in FIG. 1, refer to FIG. 2) planted on three points on the upper surface of the bed 20. To be more specific, the points are respectively arranged in the vicinity of the apexes of the triangle, which is one size smaller than the wafer base supporting bed 28. And it also has a reticle base supporting bed 32 (also one size smaller than the wafer base supporting bed 28), which is a triangle shape in a planar view being supported substantially horizontal by the legs 30A to 30B.

The second unit 14, has four struts 34A, 34B, 34C, and 34D planted on the upper surface of the base plate BP (the strut 30C and 30D located in the depth of field of the drawing is not shown in FIG. 1, refer to FIG. 2). And supported by these four struts above the reticle base supporting bed 32, is the reticle driving unit supporting bed 36 which is of a rectangular shape in a planar view. In this embodiment, the struts 34A and 34B are arranged on the edge (the bottom edge) of the barrel bed 20 on the −Y side by a predetermined interval in the X direction. Also, the struts 34C and 34D are arranged on both sides of the oblique sides of the barrel bed 20, so that the struts 34 to 34D are consequently located on each corner of the reticle driving unit supporting bed 36 (refer to FIG. 2).

The illumination optical system IOP is supported by the illumination system supporting member 38 arranged on the base plate BP. The illumination optical system IOP comprises an illumination system housing which seals the interior from the outside, and the interior of the illumination system housing is filled with a clean helium gas which has a concentration of air (oxygen) below several percent, preferably under one percent.

Within the illumination system housing, for example: a variable beam attenuator; a beam shaping optical system; a fly-eye lens system as an optical integrator; a vibration mirror; a condenser lens system; an illumination system aperture stop; a relay lens system; a reticle blind mechanism; a main condenser lens system; and the like, are housed in a predetermined positional relationship.

In the depth of field side of the drawing in FIG. 1 of the illumination optical system IOP, a beam matching unit, which is a light guiding optical system including the optical system for adjusting the optical axis, is connected at least in partial to the illumination optical system IOP. And the light source (not shown in FIG.), which is arranged on the floor FD, is connected via the light guiding optical system. As the light source, a pulse laser light source emitting pulse ultraviolet light such as a $F_2$ laser (oscillation wavelength: 157 nm), a $Kr_2$ laser (oscillation wavelength: 146 nm), and an $Ar_2$ laser (oscillation wavelength: 126 nm) are used. A light source control unit (not shown in Figures) is connected to the light source, and the light source control unit controls the oscillation center wavelength of the emitted pulse ultraviolet light, the trigger timing of the pulse oscillation, and controls the gases in the laser chamber.

The illumination optical system illuminates a slit shaped illumination area on the reticle R with a uniform illuminance. This slit shaped illumination area is set by the fixed reticle blind, which makes up the reticle blind mechanism. And in this case, the slit shaped illumination area is set so as to narrowly extend in the X-axis direction (non-scanning direction) at the center of the circular projection view of the projection optical system PL shown in FIG. 1. The width of the illumination light in the Y-axis direction (scanning direction) is set substantially uniform.

Furthermore, the light source can be arranged in a separate room (service room) having a lower degree of cleanliness than that of the clean room, or in a utility space provided underneath the floor of the clean room.

The reticle stage RST, is supported by air levitation on the reticle base supporting bed 32, and is arranged so as to drive the reticle R on the reticle base supporting bed 32 linearly in the Y-axis direction with large strokes, as well as finely drive the reticle in the X-axis, the Y-axis, and the z (rotational direction around the Z-axis) direction.

Figure 3:
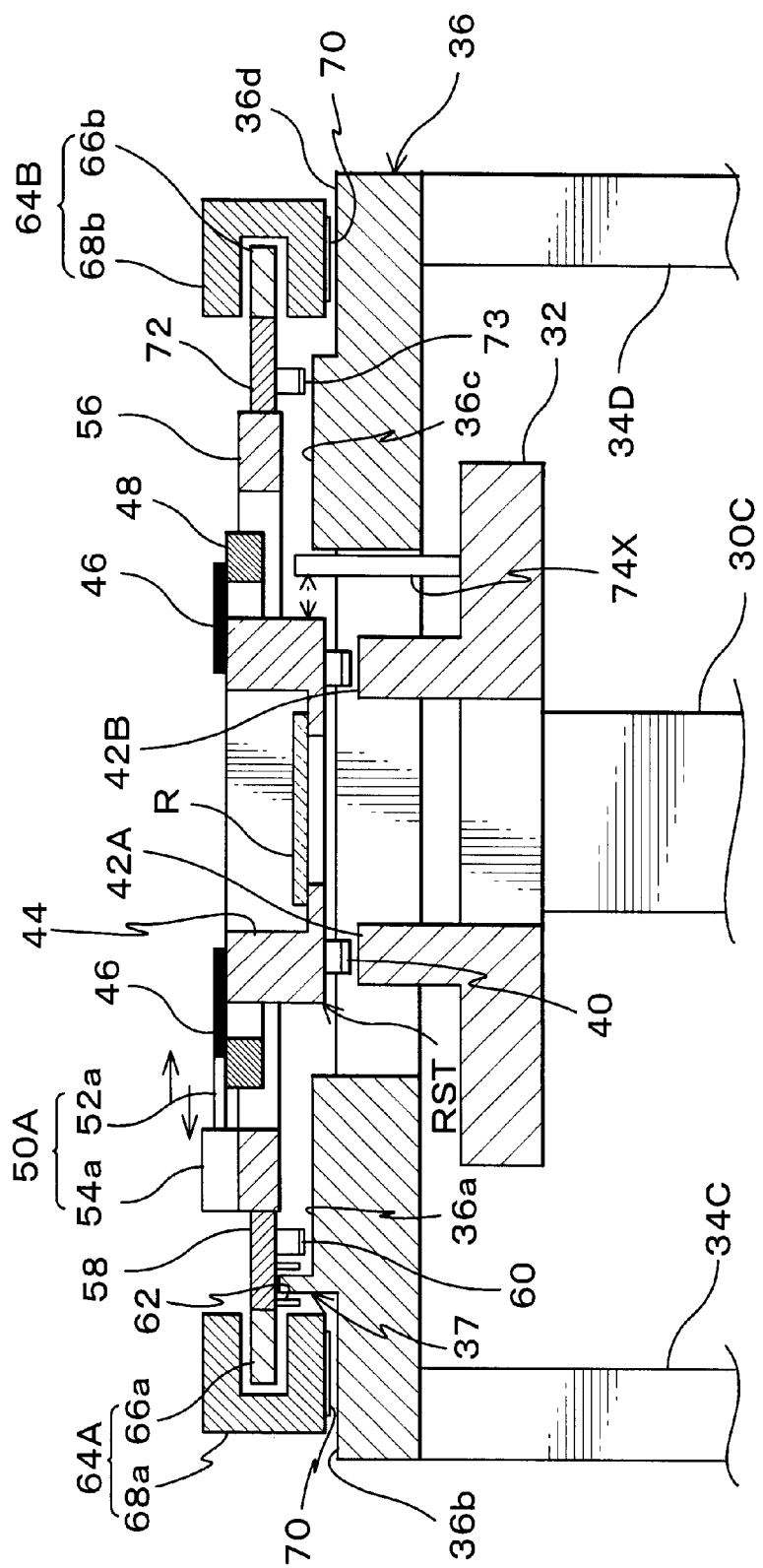
FIG. 3 is a sectional view along the line I—I in FIG. 2.

More particularly, as shown in FIG. 2 and FIG. 3, which is a sectional view of the line I—I in FIG. 2, four air-static bearings 40 are arranged on the bottom surface of the reticle stage RST. And, the reticle stage RST is supported by air levitation above a pair of Y-axis guide 42A and 42B arranged on the upper surface of the reticle base supporting bed 32, which is triangular shaped in a planar view, with the air-static bearings 40 by a predetermined clearance (such as a clearance around 5–10 $\mu$m). The air-static bearing used in this case, is the type that exhausts helium gas.

Also, around the center portion of the reticle stage RST, a recessed portion 44 is arranged that has an opening formed on the inner bottom surface that creates the path of the pulse ultraviolet light. And in this recessed portion 44, the reticle R is mounted and is fixed by an electrostatic clamping or a vacuum chuck (not shown in Figures). As can be seen, the reticle R is, in actual, arranged lower than the upper surface of the reticle stage RST. In FIG. 1, however, for the sake of simplicity of the drawing, it shows the state of the reticle R mounted on the upper surface of the reticle stage RST.

Also, as shown in FIG. 2, the reticle stage RST is connected to a XY direction fine-driving reticle frame 48 by five plate springs 46. The XY direction fine-driving reticle frame 48 is a rectangular shaped member one size larger than the reticle stage RST, which finely drives the reticle stage RST in the XY direction. With the five plate springs 46, the rigidity in the XY surface direction, that is, the X-axis direction, Y-axis direction and the θz direction, which is the rotational direction around the Z-axis direction, is sufficiently larger than the Z-axis direction, the θx direction and the θy direction. The θx direction and the θy direction are the rotational direction around the X-axis and the Y-axis.

These five plate springs 46 are arranged at line symmetric positions to the Y-axis, which passes through the center of gravity of the reticle stage RST. Therefore, even in the case a rotation moment works to tilt the reticle stage RST in respect to the XY surface due to, for example, the imbalance of the levitation force between the plurality of air-static bearings, the rotation moment is not the cause of vibration of the reticle stage RST. As is described earlier, the rigidity of the plate spring 46 in the Z direction is not large, so the reticle stage RST can precisely move along the guide 42A and 42B being supported by the plurality of air-static bearings 40.

The end of the movers 52a, 52b, and 52c, is respectively connected to the XY direction fine-driving reticle frame 48. The movers 52a, 52b, and 53c respectively structure a pair of voice coil motors 50A and 50B for fine driving in the X direction and the voice coil motor 50C for fine driving in the Y direction. The stators 54a, 54b, and 54c, which also make up the voice coil motors 50A, SOB, and 50C with the movers 52a, 52b, and 52c are fixed to the reticle frame 56. The reticle frame 56 is one size larger than the XY direction fine-driving reticle frame 48, and drives the reticle stage RST in the Y direction. The voice coil motors 50A and SOB are arranged at symmetric positions in respect to the X-axis, which passes through the center of gravity of the XY direction fine-driving reticle frame 48. The voice coil motor 50C, on the other hand, is arranged on the Y-axis that also passes through the center of gravity of the XY direction fine-driving reticle frame 48.

Therefore, by making the voice coil motors 50A and 50B generate the same amount of driving force, the XY direction fine-driving reticle frame 48 can be finely driven in the ±X direction. Also, when the voice coil motors 50A and 50B generate a different amount of driving force (including the driving force in the opposite direction), the XY direction fine-driving reticle frame 48 can be driven in the θz direction. In addition, by making the voice coil motor 50C generate a driving force, the XY direction fine-driving reticle frame 48 can be finely driven in the ±Y direction. In this case, the rigidity of the five plate springs 46 is large in the XY surface direction, that is, the X-axis direction, Y-axis direction and the θz direction, which is the rotational direction around the Z-axis direction. Therefore, when the XY direction fine-driving reticle frame 48 is driven as described above, the reticle stage RST is integrally driven with the XY direction fine-driving reticle frame 48. That is, in this embodiment, the three voice coil motors 50A, 50B, and 50C, described above, make up a fine driving unit, which substantially drives the reticle stage RST finely in the XY surface.

On one side in the X-axis direction (−X side) of the Y direction driving reticle frame 56, a supporting unit 58 is arranged projecting out. On the bottom surface of the supporting unit 58, a pair of air-static bearings 60 for supporting in the Z-axis direction, and two pairs of air-static bearings 62 for supporting in the X direction are arranged. The air-static bearing 60 and 62, also is the type that exhausts helium gas. the Y direction driving reticle frame 56, a supporting unit 72 is arranged projecting out. And, on the bottom surface of the supporting unit 72, an air-static bearing 73 for supporting in the Z-axis direction is arranged. The air-static bearing 73, also is the type that exhausts helium gas. And on the surface facing the air-static bearing 73, which is the upper surface of the reticle driving unit supporting bed 36, a Y direction driving portion Z-axis supporting guide surface 36c is formed, as shown in FIG. 3.

On the +X side of the supporting unit 72, the mover (armature unit) 66b of the linear motor 64B of the reticle stage is fixed. The U-shaped stator (magnetic pole unit) 68b, which structures the linear motor 64B of the reticle stage with the mover 66b, extends in the Y-axis direction in a state where the mover 66b is sandwiched between the two ends of the U-shaped stator 68b. On the bottom surface of the stator 68b, a plurality of air-static bearings 70 is formed for supporting the Z-axis direction, as shown in FIG. 3. And on the surface facing these air-static bearings 70, which is the upper surface of the reticle driving unit supporting bed 36, a stator Z-axis supporting guide surface 36d is formed. That is, the stator 68b is supported by air-levitation above the stator Z-axis supporting guide surface 36d with a predetermined clearance (for example, a clearance from 5 to 10 μm).

In this case, when the Y direction driving reticle frame 56 moves integrally with the XY direction fine-driving reticle frame 48 and the reticle stage RST in the scanning direction (Y-axis direction), the mover 66a and 66b of the linear motor On the upper surface of the reticle driving unit supporting bed 36, opposing the air-static bearing 60, a Y direction driving portion Z-axis supporting guide surface 36a is formed. And, the upper portion of the reticle driving unit supporting bed 36 which is arranged in between the space of the two pairs of air-static bearings 62 facing each other and extending in the Y-axis direction, serves as a yaw guide 37. And on both side surfaces of the yaw guide 37 in the X-axis direction facing the air-static bearings 62, an X-axis supporting guide surface 37a and 37b are respectively arranged (refer to FIG. 2).

The mover (armature unit) 66a of the linear motor 64A of the reticle stage is fixed on the −X side of the supporting unit 58. The U-shaped stator (magnetic pole unit) 68a, which structures the linear motor 64A of the reticle stage with the mover 66a, extends in the Y-axis direction in a state where the mover 66a is sandwiched between the two ends of the U-shaped stator 68a. On the bottom surface of the stator 68a, a plurality of air-static bearings 70 is formed for supporting the Z-axis direction, as shown in FIG. 3. And on the surface facing these air-static bearings 70, which is the upper surface of the reticle driving unit supporting bed 36, a stator Z-axis supporting guide surface 36b is formed. That is, the stator 68a is supported by air-levitation above the stator Z-axis supporting guide surface 36b with a predetermined clearance (for example, a clearance from 5 to 10 μm). Also as the air-static bearings 70, the type that exhausts helium gas is used.

On the other side in the X-axis direction (+X side) of 64A and 64B fixed to the Y direction driving reticle frame 56, and the respective stators 68a and 68b relatively move in the opposite directions.

In the case the friction becomes zero between: the reticle driving unit supporting bed 36 and the stators 68a and 68b; the supporting unit 58, 72 and the reticle driving unit supporting bed 36; and the reticle stage RST and the Y-axis direction guide 42A and 42B, the law of conservation of momentum is valid. And the stators 68a and 68b move only by a distance determined by the total mass such as those of the Y direction driving reticle frame 56, the XY direction fine-driving reticle frame 48, and the reticle stage RST, and the mass ratio between the stators 68a and 68b.

In this case, the reaction force occurring when the Y direction driving reticle frame 56, that is, when the reticle stage RST is accelerated in the scanning direction, is absorbed by the motion of the stators 68a and 68b. Thus, the vibration of the reticle driving unit supporting bed 36 can be effectively prevented by the reaction force.

In this embodiment, as is obvious from FIG. 3, the reticle base supporting bed 32, or to be more specific, the Y-axis direction guides 42A and 42B are supporting only the reticle stage RST. Therefore, the force acting on the reticle base supporting bed 32 in the gravitational direction is subtle.

Referring back to FIG. 1, on the +Z direction and +Y direction of the reticle stage RST, reflection surfaces are formed that reflect the measurement beams from the reticle laser interferometer 74, which is a positional detection unit to measure the position and moving amount of the reticle stage RST. The reticle laser interferometer 74 is fixed on the upper end of the supporting column 24.

More particularly, the side surface of the reticle stage RST in the +X direction is a first reflection surface 76a extending in the Y-axis direction. The side surface of the reticle stage RST in the +Y direction is a second reflection surface 76b extending in the X-axis direction (refer to FIG. 2). A measurement beam is irradiated in the X-axis direction from the reticle X interferometer 74X on the first reflection surface 76a, and in accordance with the reflection beam the X position of the irradiation position of the measurement beam is measured by the reticle X interferometer 74X. In addition, measurement beams are irradiated in the Y-axis direction from a pair of reticle Y interferometers $74Y_1$ and $74Y_2$ (refer to FIG. 9) on the second reflection surface 76b. And, in accordance with the respective reflection beams the Y position of the irradiation position of the measurement beams are measured by the reticle Y interferometers $74Y_1$ and $74Y_2$. Also, the fixed mirrors Mr, corresponding to each of the laser interferometers, are arranged on the side surface of the barrel of the projection optical system PL (refer to FIG. 1).

The positional information on the reticle stage RST measured by the three reticle laser interferometers described above, is sent to the stage control unit 81 (not shown in FIG. 1 to 3, refer to FIG. 9) which will be described later. The stage control unit 81 obtains the X position of the reticle stage based on the measurement value of the reticle X interferometer 74. It also obtains the Y position of the reticle stage RST based on the averaged value of the measurement values of the reticle Y interferometers $74Y_1$ and $74Y_2$. And by dividing the difference of both measurement values by the distance between the measurement axis, the rotational amount (yawing amount) of the reticle stage RST in the θz direction is scalculated. The positional information of the reticle stage RST obtained by the stage control unit 81 is supplied real-time to the main controller 80.

As is described above, in actual, three reticle laser interferometers are affixed on the upper end of the supporting column 24, however, in FIG. 1, these are representatively indicated as reticle laser interferometer 74.

The stage control unit 81, basically controls the linear motor 64A, 64B and voice coil motors 50A to 50C so that the positional information (or velocity information) output from the reticle laser interferometer 74 coincides with the instruction values (positional target, velocity target) of the main controller 80.

Hereinafter, it will be described as appropriate, that a reticle driving unit 82, which drives the reticle stage RST in the X, Y, and θz direction, is structured of the linear motors 64A, 64B and the voice coil motors 50A to 50C.

Referring back to FIG. 1, the projection optical system PL is inserted from above, in a circular opening around the center portion of the barrel supporting bed 20 in a planar view. The bed 20 is made of a casting or the like, and the direction of the optical axis AX of the projection optical system PL, is the Z-axis direction. Around the periphery of the barrel portion of the projection optical system PL, a flange FLG is provided, integrally connected with the barrel portion. As the material of the flange FLG, a material having a low thermal expansion, such as Invar (a heat resistant alloy made of nickel 36%, manganese 0.25%, and metal including carbon and other elements) is used. The flange FLG structures a so-called kinematic supporting mount, which supports the projection optical system in respect to the bed 20 at three points via a point, a plane, and a V groove. Employing this kinematic supporting mount simplifies the incorporation of the projection optical system PL to the bed 20, and moreover there are advantages of stress due to the vibration of the bed 20 and the projection optical system PL, temperature change, and posture being most effectively reduced after incorporation.

As the projection optical system PL, for example, a refraction optical system structured of only refraction optical elements (lens element) made of quartz or fluorite with a reduction magnification of 1/4, 1/5, and 1/6 is used. This system is doublet elecentric on both the object surface (reticle R) side and the image surface (wafer W) side and has a circular projection field. Therefore, when the pulse ultraviolet light is irradiated on the reticle R, the light flux from the portion irradiated by the pulse ultraviolet light of the circuit pattern area on the reticle R is incident on the projection optical system PL. Then a partial inverted image of the circuit pattern is formed in the center of the circular field on the image surface side of the projection optical system PL, being limited in a slit shape or a rectangular shape (polygonal shape) per each irradiation of the pulse ultraviolet light. With this operation, the partial inverted image of the circuit pattern projected is reduced and transferred on to a resist layer applied on the surface of a shot area among a plurality of shot areas on the wafer W arranged at the imaging surface of the projection optical system PL.

Next, the wafer stage WST and the structure of its driving unit will be described.

In FIG. 4, the structure of the respective portions of the driving unit that drives the wafer stage WST in a two dimensional direction, and its neighboring area is shown in a planar view.

As shown in FIG. 4, the driving unit 84 of the wafer stage WST is held substantially horizontal above the wafer base supporting bed 28 by the four struts 34A to 34D planted on the upper surface of the base plate BP.

The driving unit 84 comprises: a first X linear guide 86 arranged extending along the X-axis direction between the struts 34A and 34B; a second X linear guide 88 arranged extending along the X-axis direction between the struts 34C and 34D; a first and second slide unit 90A and 90B which move along the X linear guide 86 and 88; a Y linear guide 92, extending in the Y direction and has the first and second slide units 90A and 90B arranged on both ends; an XY direction moving unit 94, which moves along the Y linear guide 92.

Figure 5:
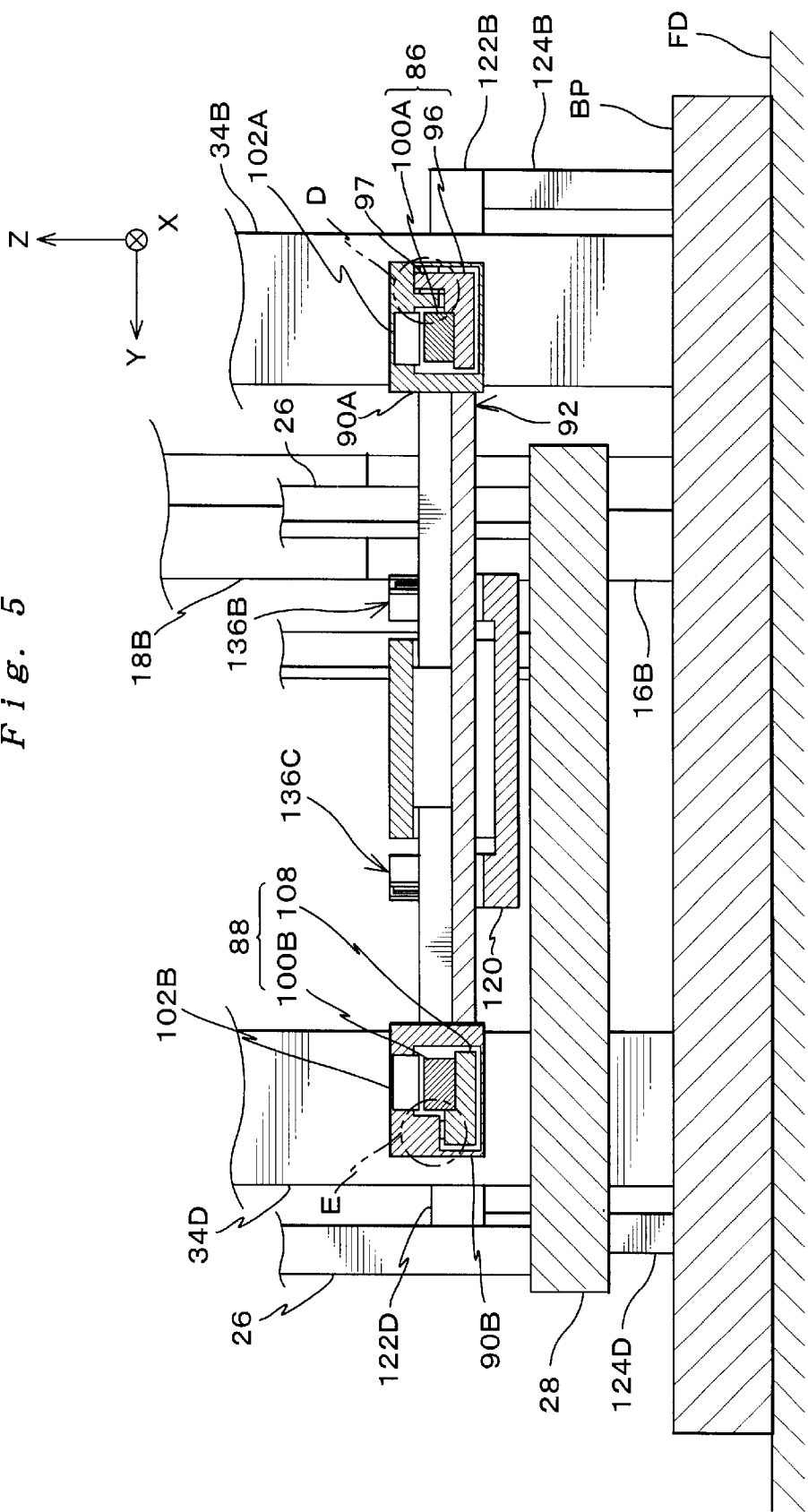
FIG. 5 is a sectional view along the line II—II in FIG. 4.
Figure 6:
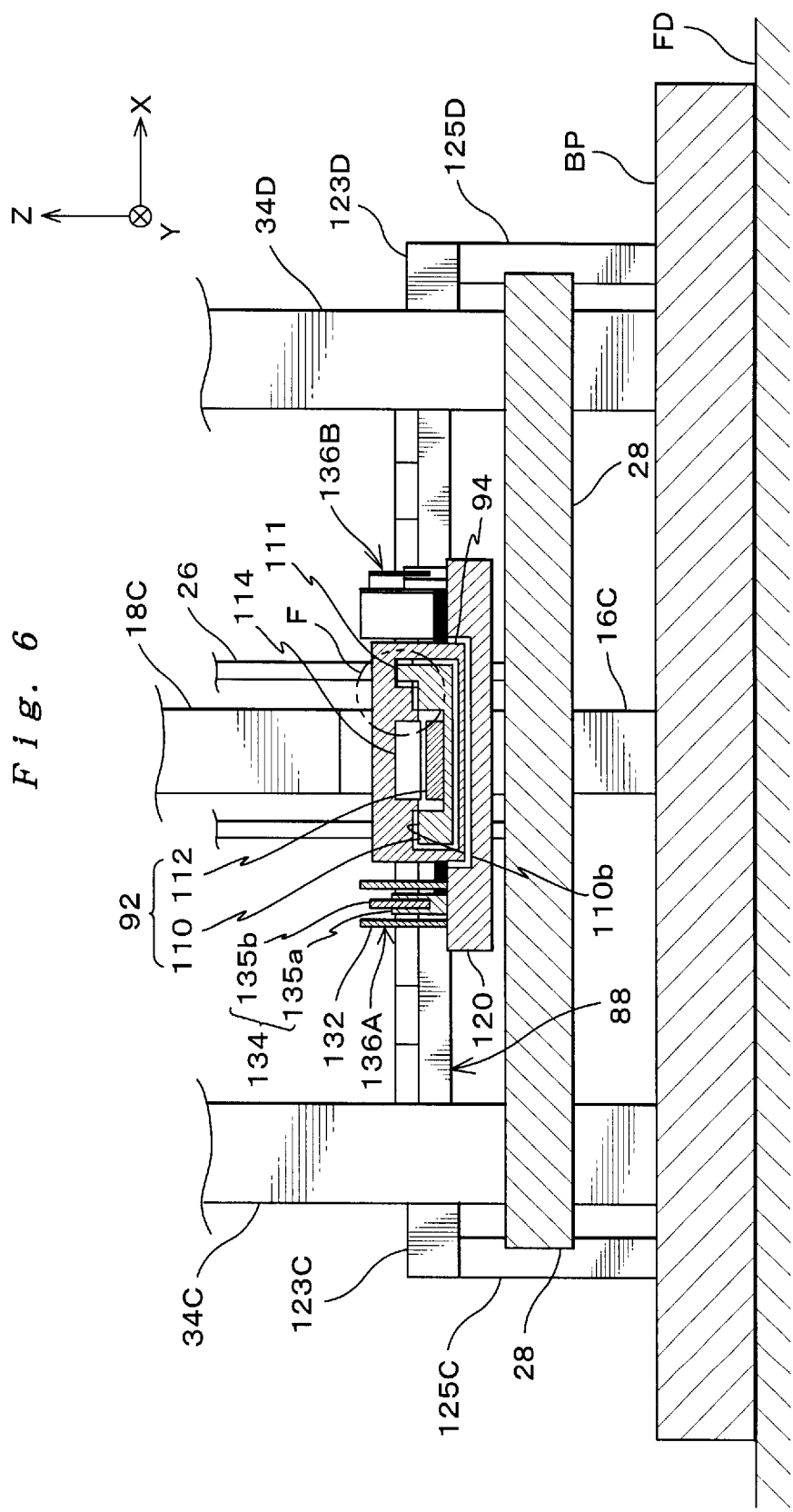
FIG. 6 is a sectional view along the line III—III in FIG. 4.

FIG. 5 shows the sectional view of the line II—II in FIG. 4, and FIG. 6 shows the sectional view of the line III—III in FIG. 4. The details of each portion of the driving unit 84 will be further described, referring to the drawings as appropriate.

Figure 7A:
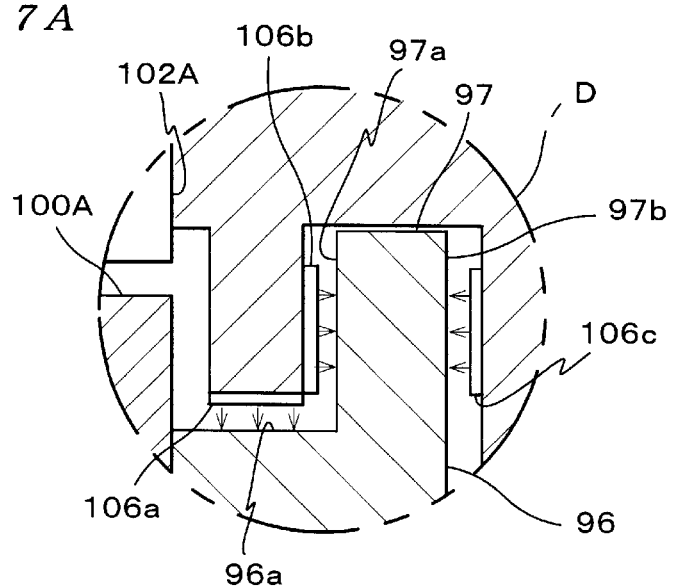
FIG. 7A is an enlarged view of the circle D indicated in FIG. 5.

The first X linear guide 86 comprises: a guide member 96, which is made of an L-shaped member when viewed in section; and a magnetic pole unit 100A made up of a plurality of permanent magnets 98 (refer to FIG. 4) arranged closely on the upper surface of the guide member 96 along the X-axis direction. On the −Y direction edge on the upper surface of the guide member 96, a projected portion 97 is arranged. On the ±Y sides of the projected portion 97, as is shown in FIG. 7A, which is the drawing enlarged of the circle D in FIG. 5, Y-axis supporting guide surfaces 97*a* and 97*b* are formed. In addition, on the upper surface of the guide member 96, which is the +Y side of the projected portion 97, a Z-axis supporting guide surface 96*a* is formed.

As shown in FIG. 5, with the first slide unit 90A, an armature unit 102A is arranged facing the magnetic pole unit 100A. In this case, the magnetic pole unit 100A and the armature unit 102A make up the first linear motor 104A (refer to FIG. 9).

Also, with the first slide unit 90A, as shown in FIG. 7A, air-static bearings 106*a*, 106*b*, and 106*c* serving as bearings are arranged respectively facing the Z-axis supporting guide surface 96*a*, and the Y-axis supporting guide surfaces 97*a* and 97*b*. The static pressure of the pressurized air exhausted from the air-static bearings 106*a* to 106*c* allows the bearing surface of the air-static bearings 106*a* to 106*c* to be supported in a non-contact manner via a predetermined clearance (for example, a clearance of around 5 μm). The air-static bearings are supported in respect to the Z-axis supporting guide surface 96*a*, the Y-axis supporting guide surfaces 97*a*, and 97*b*. As the air-static bearings, 106*a*, 106*b*, and 106*c*, the type that exhausts helium gas is used.

In this case, the air-static bearings, 106*a*, 106*b*, and 106*c* are respectively arranged at least two each, in the X direction by a predetermined interval. With this arrangement, the θz rotation (yawing) and the θy rotation (rolling) of the first slide unit 90A and the Y linear guide 92 are prevented. In other words, the projected portion 97 on which the Y-axis supporting guide surfaces 97*a* and 97*b* are formed also functions as a yaw guide.

The second X linear guide 88, comprises: a guide member 108, which is made of an L-shaped member when viewed in section; and a magnetic pole unit 100B made up of a plurality of permanent magnets 98 arranged closely on the upper surface of the guide member 108 along the X-axis direction. On the +Y direction edge on the upper surface of the guide member 108, a Z-axis supporting guide surface 108*a* is formed, as is shown in FIG. 7B, which is the drawing enlarged of the circle E in FIG. 5

On the second slide unit 90B, as shown in FIG. 5, an armature unit 102B is arranged facing the magnetic pole unit 100B. In this case, the magnetic pole unit 100B and the armature unit 102B make up the second linear motor 104B (refer to FIG. 9).

Figure 7B:
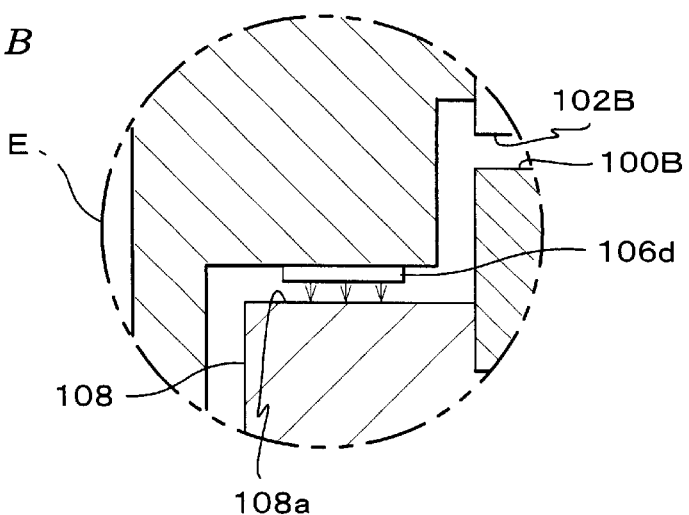
FIG. 7B is an enlarged view of the circle E indicated in FIG. 5.

In addition, with the second slide unit 90B, as shown in FIG. 7B, an air-static bearing 106*d* serving as a bearing is arranged facing the Z-axis supporting guide surface 108*a*. The static pressure of the pressurized air exhausted from the air-static bearing 106*d* allows the bearing surface of the air-static bearing 106*d* to be supported in a non-contact manner via a predetermined clearance (for example, a clearance of around 5 μm), in respect to the Z-axis supporting guide surface 108*a*. As the air-static bearing 106*d*, the type that exhausts helium gas is used.

Figure 7C:
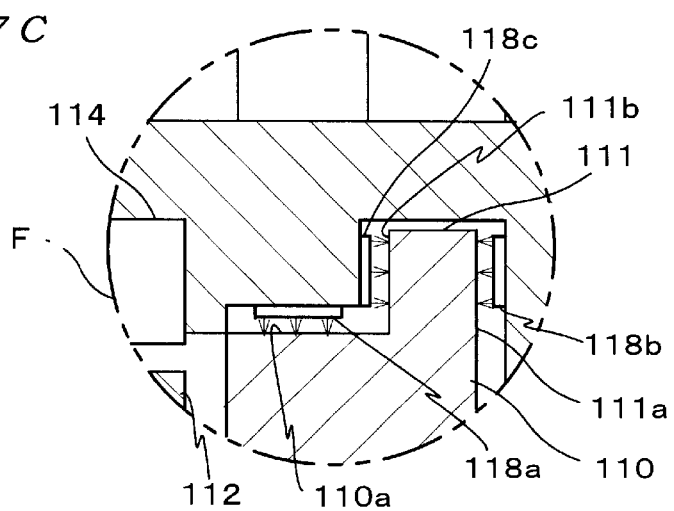
FIG. 7C is an enlarged view of the circle F indicated in FIG. 6.

The Y linear guide 92, as shown in FIG. 6, comprises: a guide member 110 which has a U-shape when viewed in section; and a magnetic pole unit 112, which is made up of a plurality of permanent magnets 98 closely arranged along the Y-axis direction, on the upper surface of the guide member 110 at the center portion in the X-axis direction. On the +X direction edge on the upper surface of the guide member 110, a projected portion 111 is arranged. On the ±X sides of the projected portion 111, as is shown in FIG. 7C, which is the drawing enlarged of the circle F in FIG. 6, X-axis supporting guide surfaces 111*a* and 111*b* are formed. In addition, on the inner side of the projected portion 111 on the upper surface of the guide member 110, a Z-axis supporting guide surface 110*a* is formed. Also, on the upper surface in the −X side of the guide member 110, a Z-axis supporting guide surface 110*b* is formed.

With the XY direction moving unit 94, as is shown in FIG. 6, an armature unit 114 is arranged facing the magnetic pole unit 112. In this case, the magnetic pole unit 112 and the armature unit 114 make up the Y linear motor 116 (refer to FIG. 9). In this embodiment, the first and second X linear motor 104A and 104B, and the Y linear motor 116 are respectively controlled by the stage control unit 81 (refer to FIG. 9).

In addition, with the XY direction moving unit 94, as shown in FIG. 7C, air-static bearings 118*a*, 118*b*, and 118*c* are respectively arranged facing the Z-axis supporting guide surface 110*a*, and the X-axis supporting guide surfaces 111*a* and 111*b*. Similarly, with the XY direction moving unit 94, an air-static bearing is arranged, facing the Z-axis supporting guide surface 111*b*.

The static pressure of the pressurized air (helium gas) exhausted from these air-static bearings allows the bearing surfaces of the air-static bearings to be supported in a non-contact manner via a predetermined clearance (for example, a clearance of around 5 μm), in respect to the respective guide surfaces.

In this case, the air-static bearings, 118*a*, 118*b*, and 118*c* are respectively arranged at least two each, in the Y direction by a predetermined interval. With this arrangement, the θz rotation (yawing) and the θx rotation (pitching) of the XY direction moving unit 94 are prevented. In other words, the projected portion 111 on which the X-axis supporting guide surfaces 111*a* and 111*b* are formed also functions as a yaw guide.

One end of the plate springs 118, two each and four in total, are respectively arranged on both the side surfaces in the ±X side of the XY direction moving unit 94 as is shown in FIG. 4. The other end of the plate springs 118, are respectively connected to an XY stage 120 of a rectangular frame shape in a planar view that structure the wafer stage WST. That is, the wafer stage WST is connected to the XY direction moving unit 94 by the four plate springs 118. In this case, the XY stage 120 is supported above the wafer base supporting bed 28 by air levitation by the air-static bearings, as will be described later. And as the four plate springs 118, springs which have a higher rigidity in the X direction, the Y direction, and the θz direction compared with the Z direction, the θx direction, and θy direction are used. Accordingly, by driving the XY direction moving unit 94, the XY stage 120 (that is, the wafer stage WST) can be integrally moved.

In addition, on the bottom surface of the XY stage 120, a plurality of air-static bearings is arranged (not shown in Figures). And by the static pressure of the pressurized gas (helium gas) exhausted from these air-static bearings, the XY stage 120 is supported above the upper surface of the wafer base supporting bed 28 in a non-contact manner via a predetermined clearance (for example, a clearance of around 5 μm). Also, since the surface of the wafer base supporting bed 28 is processed with high precision, the XY stage 120 can move with high accuracy along the surface of the wafer base supporting bed 28. On the XY stage 120, a sampling mount that holds the wafer is arranged via a sampling mount supporting unit, and the XY stage 120, the sampling mount supporting unit and the supporting mount makeup the wafer stage WST. The wafer base supporting bed 28 is only required to support the XY stage 120 and the sampling mount including the supporting unit, and does not have to support the driving unit of the wafer stage. Therefore, the force working at the wafer base supporting bed 28 in the gravitational direction is extremely small, compared with the conventional exposure apparatus. Furthermore, the wafer stage WST is capable of high-response to the focus leveling operations, which will be described later.

With the exposure apparatus 10 in the present invention, when the stage control unit 81 supplies current to the armature unit 114 arranged on the XY direction moving unit 94, the Lorentz force is generated by the electromagnetic interaction of the armature unit 114 and the magnetic pole unit 112. And by the Lorentz force, the XY direction moving unit 94, on which the armature unit 114 is arranged, is moved integrally in the +Y direction (or the −Y direction) with the wafer stage WST. That is, in this manner, the Y linear motor 116 generates the driving force. When the driving force is generated, the reaction force of the driving force acts on the Y linear guide 92 on which the magnetic pole unit is arranged. This reaction force travels via the first and second slide unit 90A and 90B, to the first and second X linear guide 86 and 88, and then further on to the four struts 34A, 34B, 34C, and 34D, making the struts vibrate. This vibration, then travels (is released) to the base plate BP and the floor FD, therefore, basically, it does not have an adverse effect on the wafer base supporting bed 28 and the main column 12 on which the bed 28 is arranged. However, in the case the vibration of the four struts 34A, 34B, 34C, and 34D exceeds a certain amount, the possibility cannot be denied that the vibration may travel sequentially to the wafer base supporting bed 28 via the four struts 34A, 34B, 34C, and 34D, base plate BP, body supporting members 16A to 16C, vibration isolation unit 18A to 18C.

Therefore, in this embodiment, as shown in FIG. 4, on the +Y side of the struts 34C and 34D, reaction force cancellation actuators 122C and 122D serving as a reaction force cancellation mechanism are arranged. And on the −Y side of the struts 34A and 34B reaction force cancellation actuators 122A and 122B serving as a reaction force cancellation mechanism are arranged. These reaction force cancellation actuators 122A to 122D are respectively supported by the supporting members 124A to 124D planted on the base plate BP (refer to FIG. 1 and FIG. 5).

Figure 9:
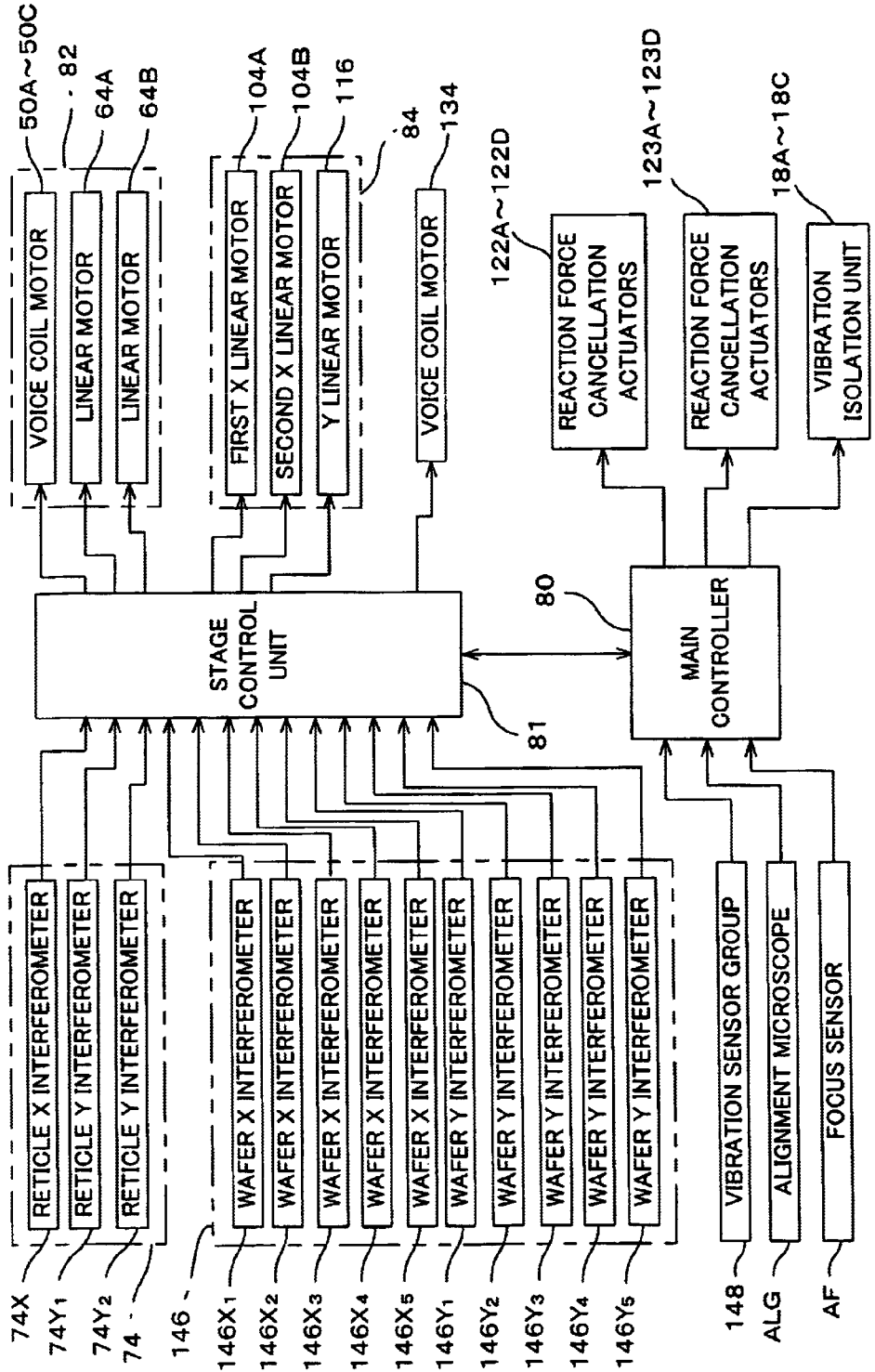
FIG. 9 is a block diagram showing an arrangement of the control system of the apparatus shown in FIG. 1.

The reaction force cancellation actuators 122A to 122D are controlled by the main controller 80 (refer to FIG. 9). The main controller 80 sends instructions to the stage control unit 81 to drive the wafer stage WST in the Y direction, and at the same time in accordance with the instructions feed forward controls the reaction force cancellation actuators 122A to 122D. This control is performed so as to make the reaction force cancellation actuators 122A and 122B, or 122C and 122D, generate a counter-force which cancels the reaction force acting in the Y-axis direction on the struts 34A to 34D. Thus, in this embodiment, the vibration, which is generated in the struts 34A to 34D when the wafer stage WST is driven in the Y direction, is attenuated almost simultaneously (without delay). Therefore, only subtle vibration travels to the base plate BP, and even if this vibration were to travel from the base plate to the wafer base supporting bed 28, it can be isolated without fail by the vibration isolation units 18A to 18C.

Also, according to the instructions from the main controller 80, when the stage control unit 81 drives the first and second X linear motor 104A and 104B at a constant velocity similar as above, the first and second slide unit 90A and 90B moves at a constant velocity in the +X direction (or the −X direction). And by this movement, the wafer stage WST is integrally moved in the +X direction (or the −X direction) with the Y linear guide 92 and the XY direction moving unit 94. When the wafer stage WST moves in the X-axis direction, the reaction force generated by the driving force of the first and second slide unit 90A and 90B acts on the first and second X linear guide, and this reaction force travels to the struts 34A to 34D, making the struts vibrate. This vibration travels (is released) to the base plate BP and the floor FD, therefore, basically, it does not have an adverse effect on the wafer base supporting bed 28 and the main column 12 on which the bed 28 is arranged. However, similarly in this case, when the vibration of the four struts 34A, 34B, 34C, and 34D exceeds a certain amount, the possibility cannot be denied that the vibration may travel sequentially to the wafer base supporting bed 28 via the four struts 34A, 34B, 34C, and 34D, base plate BP, body supporting members 16A to 16C, vibration isolation unit 18A to 18C.

Therefore, in this embodiment, on the +X side of the struts 34B and 34D, reaction force cancellation actuators 123B and 123D serving as a reaction force cancellation mechanism are arranged. And on the −X side of the struts 34A and 34C reaction force cancellation actuators 123A and 123C serving as a reaction force cancellation mechanism are arranged. These reaction force cancellation actuators 123A to 123D are respectively supported by the supporting members 125A to 125D planted on the base plate BP (refer to FIG. 1 and FIG. 6).

The reaction force cancellation actuators 123A to 123D are controlled by the main controller 80 (refer to FIG. 9). The main controller 80 sends instructions to the stage control unit 81 to drive the wafer stage WST in the X direction, and at the same time in accordance with the instructions feed forward controls the reaction force cancellation actuators 123A to 123D. This control is performed so as to make the reaction force cancellation actuators 123A and 123C, or 123B and 123D, generate a counter-force which cancels the reaction force acting on the struts 34A to 34D. Thus, in this embodiment, the vibration, which is generated in the struts 34A to 34D when the wafer stage WST is driven in the X direction, is attenuated almost simultaneously (without delay). Therefore, only subtle vibration travels to the base plate BP, and even if this vibration were to travel from the base plate to the wafer base supporting bed 28, it can be isolated without fail by the vibration isolation units 18A to 18C.

In addition, in this embodiment, as is described above, when the wafer stage is driven, the reaction force acting on the first and second X linear guide 86 and 88, and the Y linear guide 92 can be canceled out without delay. So, distortion which occurs to the first and second X linear guide 86 and 88, and the Y linear guide 92 due to the reaction force, and the errors in the rotational direction which consequently occur can be suppressed.

The four plate springs 118 are arranged at line symmetric positions to the X-axis, which passes through the center of gravity of the wafer stage WST. Therefore, even in the case a rotation moment works to tilt the reticle stage RST in respect to the XY surface due to, for example, the resisting force of the wiring (not shown in Figures) or the imbalance of the levitation force between the air-static bearings that supports the XY stage 120, the XY stage 120 has a structure which does not vibrate when the rotation moment acts on the XY stage.

In addition, on the upper surface of the XY stage 120, at a position in the vicinity of the respective apexes of the triangle, sampling mount supporting units 136A to 136C are respectively arranged. The sampling mount supporting units 136A to 136C each have a pair of sampling mount supporting rods 13 and a voice coil motor 134 serving as a driving mechanism arranged in between the sampling mount supporting rods 132. Each voice coil motor 134, as shown in FIG. 6, is made up of a stator 135a, which is fixed on the upper surface of the XY stage 120 and is U-shaped in a sectional view, and a mover 135b corresponding to the stator. Furthermore, in actual, the mover 135b of the voice coil motor 134 is fixed to the sampling mount, which will be described later in the description.

On the XY stage 120, a sampling mount 138 is mounted as is shown in FIG. 1 via the sampling mount supporting units 136A to 136C. And on the sampling mount 138, a wafer W is fixed via a wafer holder 140 (omitted in FIG. 1, refer to FIG. 8A and FIG. 8B), by electrostatic clamping or by vacuum chucking.

Figure 8A:
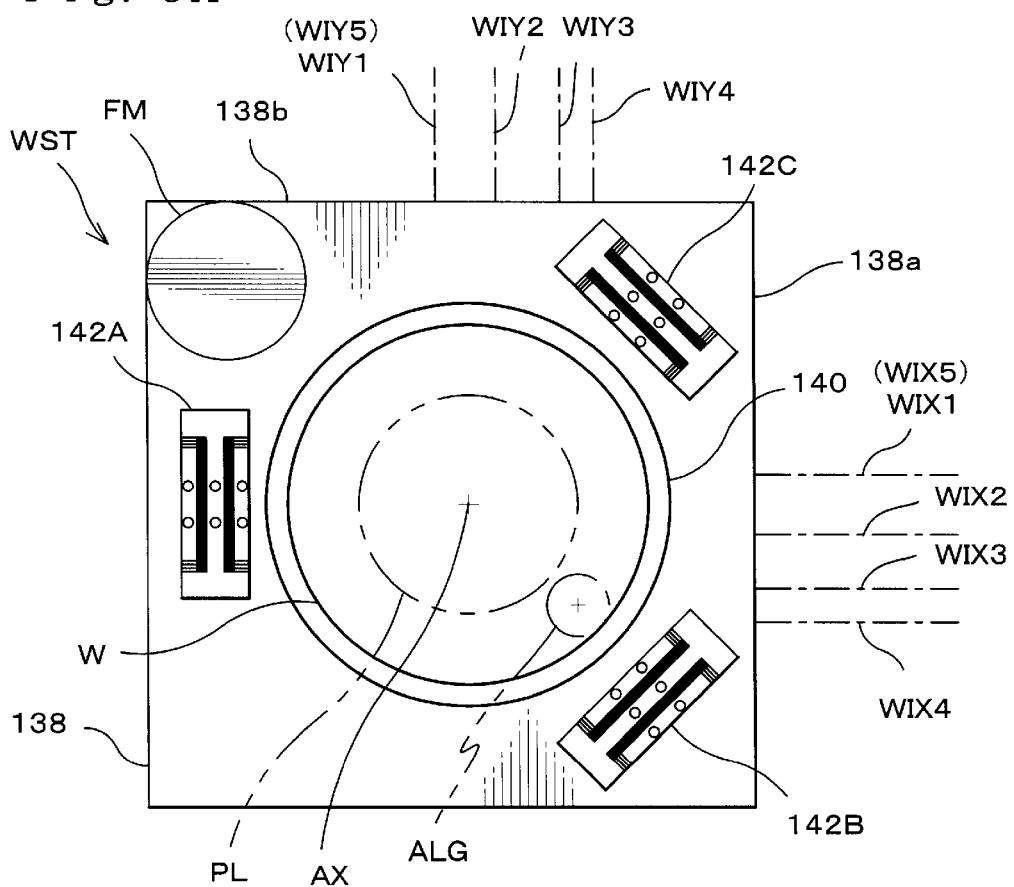
FIG. 8A is a planar view showing the wafer stage.
Figure 8B:
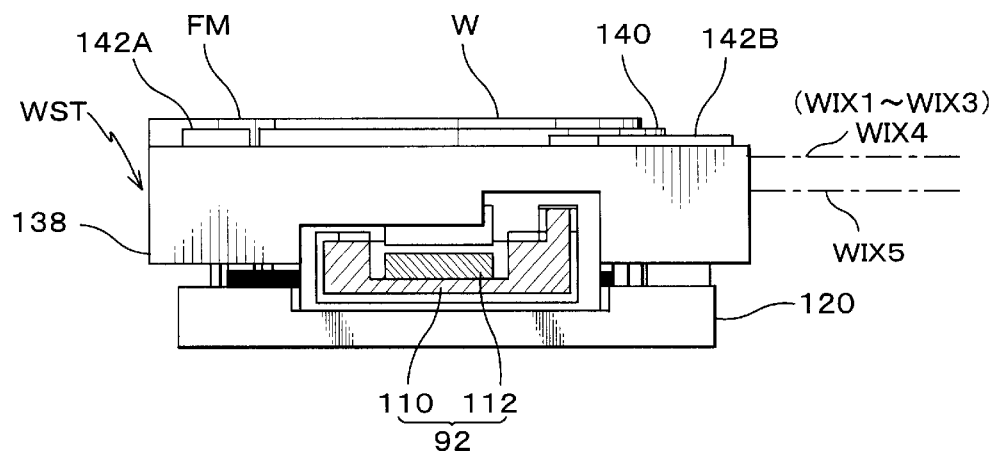
FIG. 8B is a side view of the wafer stage WST from the −Y direction in a state where the wafer stage WST is attached to the XY direction moving unit 94 by the plate springs 118.

FIG. 8A shows a planar view of the wafer stage WST, whereas FIG. 8B shows a side view of the wafer stage WST from the −Y direction in a state where the wafer stage WST is attached to the XY direction moving unit 94 by the plate springs 118. The method of assembling the sampling mount 138 into the XY stage 120 will be described next, with reference to these FIGS.

The sampling mount 138 has three pairs of openings respectively formed, which corresponds to the pair of sampling mount supporting rods 132, each pair making up the sampling mount supporting units 136A to 136C. When the sampling mount 138 is mounted on the sampling mount supporting units 136A to 136C at a predetermined position, the respective stator 135a and mover 135b of the three voice coil motors 134 become engaged. And, via the openings the sampling mount supporting rods 132 are arranged almost flush with the upper surface of the sampling mount 138. And, as is shown in FIG. 8A, three plate springs 142A, 142B, and 142C that are each a rectangular shape in total, and the middle portion of each plate is divided into three areas in the direction perpendicular to the longitudinal direction. These springs are respectively arranged at a position to face the sampling mount supporting units 136A to 136C, and the middle area of the three divided areas are respectively screwed to the sampling mount 138. The remaining two areas of the three springs are respectively screwed to each pair of the sampling mount supporting rods 132. Thus, the sampling mount 138 and the XY stage 120 (sampling mount supporting rods 132) are connected via the three plate springs 142A, 142B, and 142C. FIG. 8A and FIG. 8B both show the state where the attachment of the sampling mount 138 has been completed. The rigidity of the three plate springs 142A to 142C in the XY surface direction, that is, the rigidity in the X-axis direction, Y-axis direction and the θz direction, is particularly higher than that of the Z direction, θx direction, and θy direction. And the rigidity is highest in the direction perpendicular to the longitudinal direction. Therefore, when each supporting point is driven in the Z-axis direction and the sampling mount 138 is driven in the Z direction or tilted by the three voice coil motors 134 that structure the sampling mount supporting units 136A to 136C, the three plate springs 142A to 142C are deformed in a so-called pantograph state. Thus, excessive force does not act on the sampling mount 138, consequently suppressing the sampling mount 138 from being modified.

Furthermore, details on the arrangement of the sampling mount, or its assembly method, are disclosed, for example, in Japanese Patent Laid Open No. 09-320954.

In addition, on the upper surface of the sampling mount 138, a fiducial mark plate FM is arranged on which fiducial marks for baseline measurement and other reference marks (not shown in Figures) are formed. The off-axis alignment microscope ALG (refer to FIG. 9) detects the alignment mark (wafer mark) arranged on each shot area of the wafer W, and performs baseline measurement. And the surface of the fiducial mark plate FM is arranged at almost the same height as of the surface of the wafer W mounted on the wafer holder 140 on the sampling mount 138.

Although it is omitted in the drawings, the alignment microscope ALG is affixed to the side of the projection optical system PL at a predetermined position, and for example, image forming alignment sensors based on the image processing method are used. The measurement result of the alignment sensor ALG is sent to the main controller 80 (refer to FIG. 9).

The position of the sampling mount 138 is measured real-time with the predetermined resolution of around 0.5 to 1 nm, by a wafer laser interferometer system 146 which is fixed to the barrel supporting bed in a suspended state, as shown in FIG. 1.

More particularly, as shown in FIG. 8A, the side surface on the +X side and +Y side is mirror-processed, so as to form reflection surfaces 138a and 138b.

On one of the reflection surface 138a, five measurement beams WIX1, WIX2, WIX3, WIX4, and WIX5, are respectively irradiated in the X-axis direction from the laser interferometer $146X_1$, $146X_2$, $146X_3$, $146X_4$ and $146X_5$ (refer to FIG. 9) that structure the wafer laser interferometer system 146. The fixed mirrors Mw, corresponding to each interferometer, are fixed on the lower end of the barrel of the projection optical system PL, and each interferometer measures the X position of the irradiation position of the measurement beam with the fixed mirror as the reference (refer to FIG. 1).

The measurement beams WIX1 and WIX2 are irradiated along an optical path, almost symmetric in respect to the X-axis passing through the optical axis AX of the projection optical system on the same XY surface. Also, the measurement beams WIX3 and WIX4 are irradiated along an optical path, almost symmetric in respect to the X-axis passing through the detection center of the alignment microscope on the same XY surface. Furthermore, the measurement beam WIX5 is irradiated along the optical path directly under the measurement beam WIX1 (or WIX2)(refer to FIG. 8B).

On the remaining reflection surface 138b, five measurement beams WIY1, WIY2, WIY3, WIY4, and WIY5, are respectively irradiated in the Y-axis direction from the laser interferometer $146Y_1$, $146Y_2$, $146Y_3$, $146Y_4$ and $146Y_5$ (refer to FIG. 9) that structure the wafer laser interferometer system 146. The fixed mirrors Mw, corresponding to each interferometer, are fixed on the lower end of the barrel of the projection optical system PL, and each interferometer measures the Y position of the irradiation position of the measurement beam with the fixed mirror as the reference (refer to FIG. 1).

The measurement beams WIY1 and WIY2 are irradiated along an optical path, almost symmetric in respect to the Y-axis passing through the optical axis AX of the projection optical system on the same XY surface. Also, the measurement beams WIY3 and WIY4 are irradiated along an optical path, almost symmetric in respect to the Y-axis passing through the detection center of the alignment microscope on the same XY surface. Furthermore, the measurement beam WIY5 is irradiated along the optical path directly under the measurement beam WIY1 (or WIY2).

As is described, the interferometers that measure the sampling mount 138, are five each in the X-axis direction and the Y-axis direction, adding up to ten interferometers in total. However, in FIG. 1, these are representatively illustrated as wafer laser interferometer system 146.

The measurement results of the respective interferometers making up the wafer laser interferometer system 46, are supplied to the stage control unit 81 (not shown in FIG. 1, refer to FIG. 9) and the stage control unit 81 obtains the position of the sampling mount 138 in the following manner.

That is, upon exposure, in accordance with the instructions from the main controller 80, the stage control unit 81 obtains the X position of the sampling mount 138 based on the averaged value of the measurement values of the interferometer $146X_1$ and $146X_2$, which correspond to the measurement beams WIX1 and WIX2. And, the stage control unit 81 obtains the Y position of the sampling mount 138 based on the averaged value of the measurement values of the interferometer $146Y_1$ and $146Y_2$, which correspond to the measurement beams WIY1 and WIY2. In addition, the stage control unit 81 obtains the θy rotational amount of the sampling mount 138 based on the difference of the measurement values of the interferometer $146X_1$ and $146X_5$, and the interval of the measurement axis, which correspond to the measurement beams WIX1 and WIX5. And the stage control unit 81 obtains the θx rotational amount of the sampling mount 138 based on the difference of the measurement values of the interferometer $146Y_1$ and $146Y_5$, and the interval of the measurement axis, which correspond to the measurement beams WIY1 and WIY5. Also, the stage control unit 81 obtains the θz rotational amount of the sampling mount 138 based on at least either the difference of the measurement values of the interferometer $146X_1$ and $146X_2$ and the interval of the measurement axis, or the difference of the measurement values of the interferometer $146Y_1$ and $146Y_2$ and the interval of the measurement axis.

Also, on alignment, which will be described later, in accordance with the instructions from the main controller 80, the stage control unit 81 obtains the X position of the sampling mount 138 based on the averaged value of the measurement values of the two interferometers $146X_3$ and $146X_4$, which correspond to the measurement beams WIX3 and WIX4. And the Y position of the sampling mount 138 is also obtained based on the averaged value of the measurement values of the two interferometers $146Y_3$ and $146Y_4$, which correspond to the measurement beams WIY3 and WIY4. In this case as well, the stage control unit 81 can obtain the θx, θy, and θz rotational amount of the sampling mount likewise, as described above.

Furthermore, the positional information of the sampling mount 138 that the stage control unit 81 obtained, is sent real-time, to the main controller 80.

As is described, in this embodiment, in either case of exposure or alignment, accurate positional measurement of the sampling mount 138 is possible, without the influence of the so-called Abbe error.

On the wafer base supporting bed 28, although it is omitted in FIG. 1, in actual, three vibration sensors (for example, accelerometers) are arranged to measure the vibration of the wafer base supporting bed 28 (the main column 12) in the Z direction. Another three vibration sensors (for example, accelerometers) (for example, of the three vibration sensors two measure the vibration of the wafer base supporting bed 28 in the Y direction, and the remaining measures the vibration in the X direction) are also arranged on the wafer base supporting bed 28 to measure the vibration in the XY plane direction. In the following description, these six vibration sensors will be collectively referred to as the vibration sensor group 148. The measurement values of the vibration sensor group 148 are sent to the main controller 80 (refer to FIG. 9). Accordingly, the main controller 80 can obtain the vibration of the wafer base supporting bed 28 based on the measurement values of the vibration sensor group 148 in directions of six degrees of freedom (X, Y, Z, θx, θy, and θz).

For example, when driving the wafer stage WST as was described earlier, and an offset load caused by the movement of the wafer stage WST acts on the wafer base supporting bed 28 making the wafer base supporting bed 28 vibrate, the main controller 80 detects the vibration of the wafer base supporting bed 28 in directions of six degrees of freedom. And according to the detection results, the main controller 80 controls the vibration isolation units 18A to 18C to effectively suppress the vibration of the wafer base supporting bed 28.

However, as was described earlier, in this embodiment, when the wafer stage WST is being driven, the offset load acting on the wafer base supporting bed 28 with the movement of the wafer stage WST is extremely small. Therefore, the vibration sensor group 148 does not necessarily have to be arranged. That is, as the vibration isolation unit 18A to 18C, a passive vibration isolation unit may be employed, instead of an active vibration isolation unit.

Furthermore, with the exposure apparatus in this embodiment, a focus sensor AF (omitted in FIG. 1, refer to FIG. 9) for detecting the position of the wafer W in the Z direction, is fixed on the lower end portion of the barrel of the projection optical system PL via a holding member (not shown in Figures). As the focus sensor AF, a multiple focal position detection system which details are disclosed in, for example, Japanese Patent Laid Open No. 06-283403 and the corresponding U.S. Pat. No. 5,448,332, is used. The output of the focus sensor AF is sent to the main controller 80, and the main controller 80 controls the Z driving and tilt of the sampling mount 138 via the stage control unit 80, and performs the so-called focus leveling. The disclosure of the above U.S. Patent is fully incorporated herein by reference.

FIG. 9 is a chart simply showing the structure of the control system related to stage driving and vibration isolation during exposure. The main controller 80 and the stage control unit 81 consisting of a workstation (or a microcomputer) play the main role in this control system. The main controller 80, performs various controls described so far, as well as controls the entire apparatus in total.

Next, the exposure operation of the exposure apparatus having the structure described above, will be described.

As a premise, various exposure conditions are set beforehand in order to perform scanning exposure on the shot area of the wafer W by an appropriate exposure amount (target exposure amount). Also, preparatory operations such as reticle alignment and baseline alignment, using equipment such as the reticle microscope and the off-axis alignment microscope AGL are performed. And after the fine alignment of the wafer W using the alignment microscope AGL (for example, EGA (Enhanced Global Alignment), which details are disclosed in, Japanese Patent Laid Open 61-44429 and the corresponding U.S. Pat. No. 4,780,617) is completed, the arrangement coordinates of a plurality of shot areas on the wafer W are obtained. The disclosure of the above U.S. Patent is fully incorporated herein by reference.

When the preparatory operations to expose the wafer W is completed in this manner, the main controller 80 instructs the stage control unit 81 to move the wafer stage WST to the starting position of scanning exposure on the first shot on the wafer W, based on the alignment results. With this instruction, the stage control unit 81 positions the wafer stage WST starting position of scanning exposure on the first shot on the wafer W by driving and controlling the respective motors that make up the driving unit 84, while monitoring the measurement values of the wafer laser interferometer system 146.

Next, the stage control unit 81 starts the scanning of the reticle stage RST and the wafer stage WST in the Y direction via the driving unit 82 and 84 in accordance with the instructions from the main controller 80. And when both the reticle stage RST and the wafer stage WST reaches the respective target scanning velocity, the pattern area of the reticle R begins to be irradiated by the pulse ultraviolet light, and thus scanning exposure begins.

The stage control unit 81 synchronously controls the reticle stage RST and wafer stage WST via the driving unit 82 and 84 so that during the scanning exposure described above in particular, the movement velocity Vr of the reticle stage RST in the Y-axis direction and the movement velocity Vw of the wafer stage WST in the Y-axis direction are maintained at a velocity ratio corresponding to the projection magnification (1/4, 1/5, or 1/6) of the projection optical system PL. While this is being performed, the main controller 80 uses the focus sensor AF to measure the Z position of the wafer W. And, in accordance with the measurement result, the main controller 80 controls the three voice coil motors on the wafer stage WST via the stage control unit 81 as appropriate, and performs focus leveling control so that the irradiation area of the pulse ultraviolet light on the surface of the wafer always coincide within the range of the best image plane of the projection optical system PL.

Then, the pulse ultraviolet light sequentially illuminates different areas of the pattern area formed on the reticle R, and by completing illumination of the entire pattern area, scanning exposure of the first shot area on the wafer W is completed. And, in this manner, the pattern formed on the reticle R is reduced and transferred onto the first shot area via the projection optical system PL.

When scanning exposure of the first shot area is completed as is described, according to the instructions from the main controller 80, the stage control unit 1 steps the wafer stage WST in the X-axis and Y-axis direction via the driving unit 84. With this operation, the wafer stage WST is moved to the scanning starting position for exposure on the second shot area. When the stepping is being performed, the stage control unit 81 measures the positional displacement of the wafer stage WST (wafer W) in the X, Y, and θz direction real-time based on the measurement values of the wafer laser interferometer system 146. And according to the measurement results, the stage control unit 81 controls the position of the wafer stage WST via the driving unit 84 so that the XY positional displacement of the wafer stage WST is set at a predetermined state.

In addition, the stage control unit 81 controls the driving unit 82 in accordance with the information on displacement of the wafer stage WST in the θz direction, and rotatably controls the reticle stage RST to compensate for the rotational displacement on the wafer W side. The stage control unit 81 also controls the thrust distribution factor of the first X linear motor 104A and the second X linear motor 104B in accordance with the displacement information of the wafer stage WST in the θz direction, and corrects the rotational error of the wafer stage WST.

Then, the stage control unit 81 performs scanning exposure on the second shot area, likewise with the first shot area.

In this manner, scanning exposure on the shot area on the wafer W and the stepping operation for exposure of the following shot area is repeatedly performed, thus the pattern of the reticle R is sequentially transferred onto the entire shot area on the wafer W.

The air conditioning system of the exposure apparatus 10 in this embodiment will be described next, based on FIG. 10. The exposure apparatus 10 is arranged within a predetermined chamber as a whole. However, air conditioning units, which serve as a plurality of air conditioning rooms to respectively house each portion of the exposure apparatus 10, are further arranged within the chamber. The air conditioning units are independent by unit, and are each air conditioned separately. This type of air conditioning system is hereinafter referred to as "air conditioning system by unit".

Figure 10:
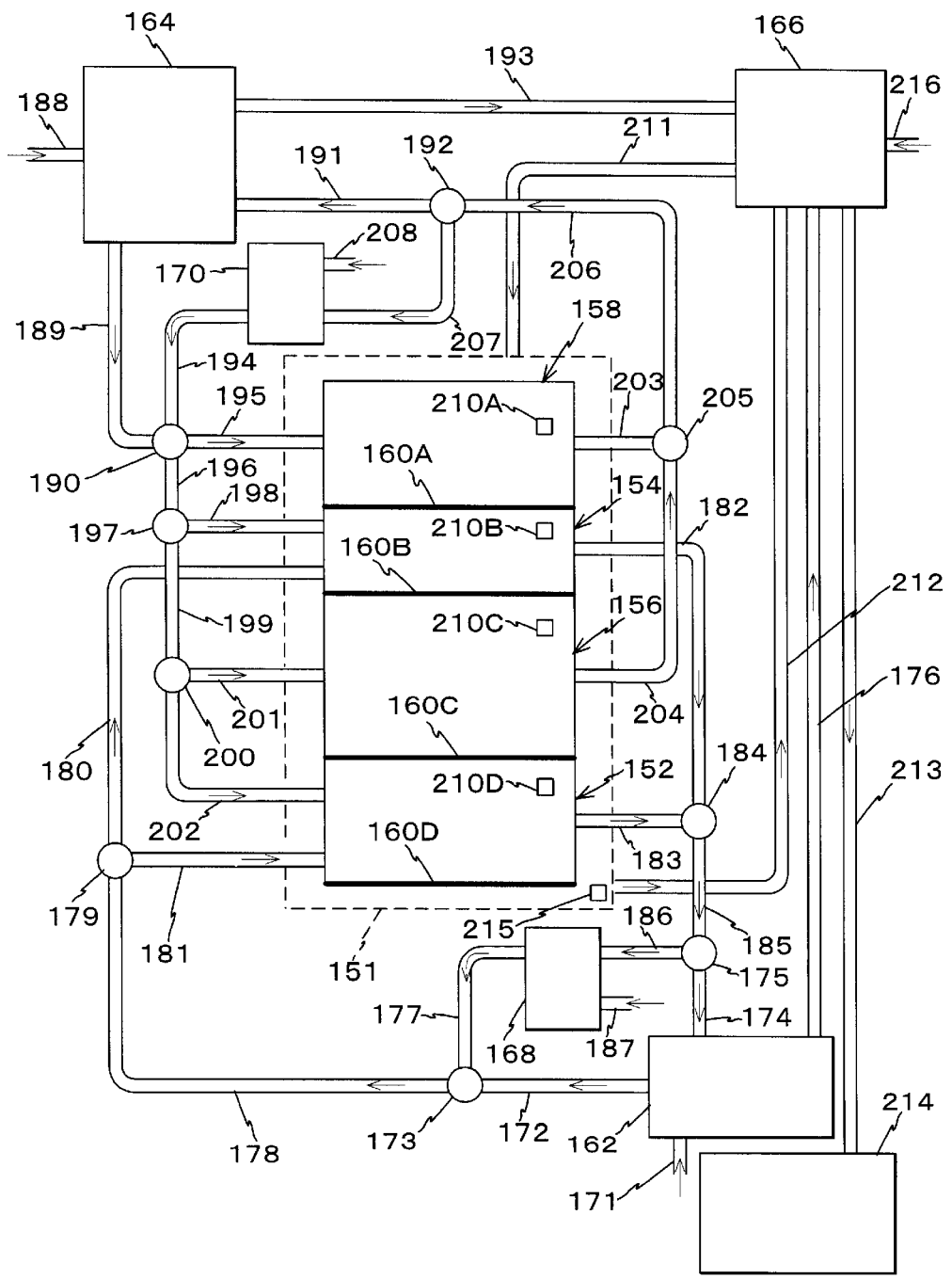
FIG. 10 is a modeled view showing the arrangement of the air conditioning system by unit described in the embodiment.

FIG. 10 is a simplified arrangement of the air conditioning system by unit in this embodiment. As shown in FIG. 10, within the chamber 151, a wafer stage system unit 152 serving as a first air conditioning room, a reticle stage system unit 154 serving as a second air conditioning room, a projection optical system unit 156 serving as a third air conditioning room, and a illumination system unit 158 serving as a fourth air conditioning room, are arranged. In this embodiment, the wafer stage system unit 152 and the reticle stage system unit make up the first type of air conditioning room of the present invention, whereas the projection optical system unit 156 and the illumination system unit 158 make up the second type of air conditioning room of the present invention.

More particularly, the reticle stage system unit 154 is arranged immediately below the illumination system unit 158. Similarly, the projection optical system unit 156 is arranged immediately below the reticle stage system unit 154, and, the wafer stage system unit is arranged immediately below the projection optical system unit 156.

In this case, partition walls are arranged between: the illumination system unit 158 and the reticle stage system unit 154; the reticle stage system unit 154 and the projection optical system unit 156; the projection optical system unit 156 and the wafer stage system unit 152; and on the bottom surface side of the wafer stage system unit 152. These partition walls are respectively formed of a sheet member being chemically cleaned, that is, pressure resistant sheet 160A, 160B, 160C and 160D. The partition walls of the remaining portions are made of chemically cleaned metal, such as stainless steel.

On the sheet member 160A that divides the illumination system unit 158 and the reticle stage system unit 154, an opening is partially formed. This opening has a size, in which the illumination system housing can be inserted. And in a state where the illumination system housing is inserted, the sheet member 160A is fixed to the illumination system housing by the fastening mechanism that will be described later. In this case, a part of the partition wall is made up of the optical members (lens or plane-parallel glass) of the reticle side housed in the illumination system housing.

Also, on the sheet member 160B that divides the reticle stage system unit 154 and the projection optical system unit 154, an opening is partially formed. This opening has a size, in which the object side of the projection optical system PL can be inserted. And in a state where the object side of the projection optical system PL is inserted, the sheet member 160B is fixed to the projection optical system PL by the fastening mechanism that will be described later. In this case, a part of the partition wall is made up of the optical members (lens or plane-parallel glass) of the object side of the projection optical system.

Furthermore, on the sheet member 160C that divides the projection optical system unit 154 and the wafer stage system unit 152, an opening is partially formed. This opening has a size, in which the image plane side of the projection optical system PL can be inserted. And in a state where the image plane side of the projection optical system PL is inserted, the sheet member 160C is fixed to the projection optical system PL by the fastening mechanism that will be described later. In this case, a part of the partition wall is made up of the optical members (lens or plane-parallel glass) of the image plane side of the projection optical system.

In the illumination system unit 158, the illumination system housing, and the illumination optical system IOP that is housed in the illumination system housing, are housed. And the illumination optical system IOP comprises: a variable beam attenuator; a beam shaping optical system; a fly-eye lens system; a vibration mirror; a condenser lens system; an illumination system aperture stop; a relay lens system; a reticle blind mechanism; a main condenser lens system; and the like.

In the reticle stage system unit 154, the edge surface of the object side (reticle side) of the projection optical system PL, the reticle stage RST, the reticle driving unit supporting bed 36, the reticle base supporting bed 32, the driving unit 82, the optical path between the reticle R and the illumination optical system IOP, and the optical path between the reticle R and the projection optical system, are housed. Also, in this embodiment, the arrangement surface of the pressure resistant sheet 160A almost coincides with the edge surface of the object side of the projection optical system In the projection optical system unit 156, most of the projection optical system PL excluding a part of the projection optical system PL on the image plane side is housed.

And, in the wafer stage system unit 152, the edge surface of the image plane side (wafer side) of the projection optical system PL, the wafer stage WST, the driving unit 84, the upper half of the wafer base supporting bed 28, the optical between the projection optical system and the wafer W, are housed.

In this embodiment, as the pressure resistant sheet 160A to 160D, a sheet which has a double structure (a three layered structure) issued. This pressure resistant sheet is, in actual, covered on the surface (both on the front and the back surface) with a sheet having gone through a degassing process, thus has a double structure.

In this case, a sheet having gone through a degassing process, is for example, a sheet that is made of fluoropolymers and is secondary vulcanized. Another example, is a sheet that is made so that generation of gas absorbing the exposure light and of organic contaminants adhering on the surface of the optical members as a reaction to the exposure light are suppressed. And the surface of such a sheet, is made of various polymer materials such as fluoropolymers, tetrafluoroethylene, tetrafluoroethylene-tetrafluoro (alkyl vinyl ether), or tetrajluoroethylene-hexafluoropropene copolymer.

In this embodiment, to each of the illumination system unit 158, reticle stage system unit 154, projection optical system unit 156, and the wafer stage system unit 152, a predetermined gas can be supplied and exhausted independently. As the air conditioning control unit for this arrangement, a first air conditioning control unit 162 and a second air conditioning control unit 164 are provided. The first air conditioning control unit 162 air-conditions the wafer stage system unit 152 and the reticle stage system unit 154. This unit supplies helium gas (helium gas with purity of a moderate level: the first gas for air conditioning) that has a relatively high purity (concentration) to the wafer stage system unit 152 and the reticle stage system unit 154. This helium gas is supplied from a helium gas cylinder (not shown in Figures). And, the second air conditioning control unit 164 air-conditions the illumination system unit 158 and the projection optical system unit 156. This unit supplies helium gas (helium gas with a high purity level: the second gas for air conditioning) which purity (concentration) is higher than that of the first gas described above to the illumination system unit 158 and the projection optical system unit 156. This helium gas is also supplied from a helium gas cylinder (also not shown in Figures). The second air conditioning control unit is capable of partial air conditioning (which will be described later) of the wafer stage system unit 152 and the reticle stage system unit 154, depending on the requirement.

Furthermore, in this embodiment, a third air conditioning control unit, a fourth air conditioning control unit, and a fifth air conditioning control unit is respectively arranged. The third air conditioning control unit performs total air conditioning of the chamber 151 outside each air conditioning unit, whereas the fourth air conditioning control unit performs air conditioning of the reticle stage system unit 154 and wafer stage system unit 152 during maintenance. And the fifth air conditioning control unit performs air conditioning of mainly the illumination system unit 158 during maintenance.

The first, second, third, fourth, and fifth air conditioning control unit 162, 164, 166, 168, and 170 each have: an air filter to remove particles such as a HEPA filter (high efficiency particulate air filter) or a ULPA filter (ultra low penetration air filter) (hereinafter referred to simply as "air filter"); a chemical filter (such as activated carbon or zeolite) which removes organic contaminants (including impurities generated from the construction material of the exposure apparatus) generated from photochemical reaction to the exposure light adhering on the surface of the optical member; and an ozone removal filter (manganese dioxide or titanium oxide) which removes ozone concentrated in the gas supplied. In the case of using an $F_2$ laser beam or a vacuum ultraviolet light that has a shorter wavelength as the illumination light for exposure, the vacuum ultraviolet light is absorbed by gas such as oxygen, water vapor, and hydrocarbon gas on the optical path. Therefore, a filter to remove impurities needs to be arranged in each of the air conditioning control units 162, 164, and 166, to remove gas (hereinafter referred to as absorptive gas) such as oxygen, water vapor, carbon dioxide, and organic gas (such as impurities generated from the construction material of the exposure apparatus), which exist in the helium gas supplied to each unit.

In the case of arranging the impurities removal filter, helium with high purity is supplied to the second air conditioning unit 164, whereas helium with moderate purity is supplied to the first air conditioning unit 162 and the third air conditioning unit 166. Therefore, the function of the impurities removal filter may differ between the filter arranged in the second air conditioning unit 164 and the filters arranged in the first air conditioning unit 162 and the third air conditioning unit 166.

Also, the third air conditioning unit 166 needs to take in air during maintenance operations, therefore, comprises a switching unit that changes the flowing path of the gas in the third air conditioning unit. So, at times other than maintenance, such as during normal operations, gas supplied to the chamber 151 pass through the impurities removal filter.

Furthermore, the case has been described where all the air conditioning control units have the ozone removal filter. However, if ozone is to be generated from photochemical reaction of the extremely small amount of oxygen in each unit to the exposure light, the ozone removal filter need only to be arranged in the first, second, and third air controlling control unit 162, 164, and 166.

The details of each air conditioning control unit will be described later.

In the first air conditioning control unit 162, a first and second air supply port and a first and second exhaust port are arranged. Of these ports, the first air supply port is connected to the first helium gas cylinder (not shown in Figures), which contains the helium gas of moderate purity via the piping 171. And the first exhaust port is connected to the first air supply port of the first switching unit 173 via the piping 172. In addition, the second air supply port is connected to the first exhaust port of the second switching unit 175 via the piping 174. And the second exhaust port is connected to the first air supply port of the third air conditioning control unit 166 via the piping 176.

The first switching unit 173 has a second air supply port and an exhaust port, other than the first air supply port mentioned above. To the second air supply port, the exhaust port of the fourth air conditioning control unit 168 is connected via the piping 177, and to the exhaust port, one end of the piping 178 is connected. The other end of the piping 178 is connected to the air supply port of the airflow volume control unit 179. And, the first and second exhaust port of the airflow volume control unit 179 are respectively connected to the first air supplying portion of the reticle stage system unit 154 and the first air supplying portion of the wafer stage system unit 152.

The exhaust portion of the reticle stage system unit 154 and the wafer stage system unit 152 are respectively connected to the first and second air supply port of the airflow volume control amount unit 184 via the piping 182 and the piping 183. The exhaust port of the airflow volume control amount unit 184 is connected to the air supply port of the second switching unit 175 mentioned above via the piping 185. Also, the second exhaust port of the second switching unit 175 is connected to the first air supply port of the fourth air conditioning control unit 168. And, the fourth air conditioning control unit 168 has a second air supply port besides the first air supply port, and the second air supply port is connected to one end of the piping 187, which other end is open to the outer air outside the chamber 151.

In the second air conditioning control unit 164, a first and second air supply port and a first and second exhaust port are arranged. Of these ports, the first air supply port is connected to the second helium gas cylinder (not shown in Figures), which contains the helium gas of high purity via the piping 188. And the first exhaust port is connected to the first air supply port of the third switching unit 190 via the piping 189. In addition, the second air supply port is connected to the first exhaust port of the fourth switching unit 192 via the piping 191. And the second exhaust port is connected to the second air supply port of the third air conditioning control unit 166 via the piping 193.

The third switching unit 190 has a second air supply port and a first and second exhaust port, other than the first air supply port mentioned above. To the second air supply port, the exhaust port of the fifth air conditioning control unit 170 is connected via the piping 194. The first exhaust port of the third switching unit 190 is connected to the air supplying portion of the illumination system unit 158 via the piping 195. And the second exhaust port of the third switching unit 190 is connected to the air supply port of the airflow volume control unit 197. The first exhaust port of the airflow volume control unit 197 is connected to the second air supplying portion of the reticle stage system unit 154 via the piping 198. And, the second exhaust portion is connected to the air supply port of the airflow volume control unit 200 via the piping 199. The first and second exhaust port of the airflow volume control unit 200 are respectively connected to the air supplying portion of the projection optical system unit 154 and the second air supplying portion of the wafer stage system unit 152.

The exhaust portion of the illumination system unit 158 and the projection optical system unit 156 are respectively connected to the first and second air supply port of the airflow volume control amount unit 205 via the piping 203 and the piping 204. The exhaust port of the airflow volume control amount unit 205 is connected to the air supply port of the fourth switching unit 192 mentioned above via the piping 206. Also, the second exhaust port of the fourth switching unit 192 is connected to the first air supply port of the fifth air conditioning control unit 170 via the piping 207. And, the fifth air conditioning control unit 170 has a second air supply port besides the first air supply port, and the second air supply port is connected to one end of the piping 208, which other end is open to the outer air outside the chamber 151.

Inside the illumination system unit 158, the reticle stage system unit 154, the projection optical system unit 156, and the wafer stage system unit 152, a first concentration sensor 210A, 210B, 210C, and 210D are respectively arranged in the vicinity of the exhausting portion. These concentration sensors 210A, 210B, 210C, and 210D respectively include an impurities concentration sensor, an oxygen sensor and an ozone sensor, for measuring the concentration in the absorptive gas. The measurement values of these concentration sensors 210A, 210B, 210C, and 210D are sent to the main controller 80, and the main controller 80 then monitors the concentration of helium gas in the gas used to air-condition each air conditioning unit according to these measurement values. To be more specific, the main controller 80 monitors whether either one of the detection values of the impurities concentration sensor or the ozone sensor, making up the first concentration sensor, has exceeded the first threshold value of the impurities concentration or the second threshold value of the ozone concentration. And in accordance with the measurement values of the concentration sensors 210A, 210B, 210C, and 210D, when the main controller 80 detects that the impurities concentration or the ozone concentration in any of the air conditioning unit has exceeded the first threshold value mentioned above, it acknowledges that the concentration of the helium gas used for air-conditioning the unit corresponding to the sensor has fallen under the predetermined value set beforehand. Also, the main controller 80 monitors whether the detection values of the oxygen sensor concentration of the respective first concentration sensors are of a normal air concentration upon maintenance.

This embodiment has been described with a structure of the concentration sensors arranged within each air conditioning unit. Alternatively, gas may be selectively supplied from the respective air conditioning unit and measured by one concentration sensor. That is, one concentration sensor may be arranged which is connected to the respective air conditioning units via piping with a flowing path switching valve arranged in between.

Meanwhile, when gas is being replaced, which operation will be described later, the main controller 80 monitors whether the impurities concentration and the ozone concentration are under the second threshold value of the impurities concentration and the second threshold value of the ozone concentration, set by each air conditioning unit of the ozone concentration. And when both the impurities concentration and the ozone concentration are under the second threshold values, it acknowledges that the operation of replacing gas has been completed.

In addition, in this embodiment, as is shown in FIG. 10, the first exhaust port of the third air conditioning control unit 166 is connected to the air supplying portion arranged at the ceiling portion of the chamber 151 via the piping 211. Furthermore, a gas storing mechanism 214 serving as a storing mechanism is connected to the second exhaust port of the third air conditioning control unit 166 via the piping 213. And the fourth air supply port of the third air conditioning control unit 166 is connected to one end of the piping 216, which other end is open to the outer air outside the chamber 151.

Also, in the vicinity of the exhausting portion of the chamber 151, a second concentration sensor 215 is arranged which includes an impurities concentration sensor and an ozone sensor. The measurement value of the second concentration sensor 215 is sent to the main controller 80, and the main controller 80 monitors the concentration of the helium gas in the gas used to air-condition the internal air of the chamber 151. That is, the main controller 80 monitors whether either of the detection values of the impurities concentration sensor or the ozone sensor exceeds the threshold values of the impurities concentration and ozone concentration set in advance. And when either of the detection values of the impurities concentration sensor or the ozone sensor does actually exceed the threshold value, the main controller 80 detects the fact. The main controller 80 then acknowledges that the concentration of the helium gas in the gas used for air-conditioning the chamber has fallen below the predetermined value set in advance.

Next, the air conditioning operations of each air conditioning unit and the chamber 151 will be described. The operations are performed by the first air conditioning control unit 162, the second air conditioning control unit 164, and the third air conditioning control unit 166 that play the main role in the air conditioning system described above, under the control of the main controller 80.

First, the operation in a normal state, that is, operation excluding the maintenance operation will be described.

The following description is of air conditioning, which uses the helium gas with purity of a moderate level, supplied from the first air conditioning control unit 162.

In a normal state, the first exhaust port and the third air supply port of the third air conditioning control unit 166 is in an "opened" state, whereas the other ports are in a "closed" state. And with the second switching unit 175, in a normal state, the air supply port and the first exhaust port is in an "opened" state, and the second exhaust port is in a "closed" state.

In a normal state, the first air supply port and the second exhaust port of the first air conditioning control unit 162 are in an "opened" state, whereas the second air supply port and the first exhaust port are in a "closed" state. And the first air conditioning control unit 162 adjusts the temperature and the flowing amount of the first gas (helium gas with purity of a moderate level) returned from the reticle stage system unit 154 and the wafer stage system unit 152 via the piping 174 and the second switching unit 175, then supplies it to the first switching unit 173 via the piping 172.

In a normal state, with the first switching unit 173, the first air supply port and the exhaust port are in an "opened" state, and the second air supply port is in a "closed" state. The first switching unit 173 supplies the helium gas with purity of a moderate level coming from the first air conditioning control unit 162 via the piping 172, to the airflow volume control unit 179 via the piping 178.

With the airflow volume control unit 179, in a normal state, the air supply port and the first and second exhaust port are all in an "opened" state. The airflow volume control unit 179 adjusts the temperature and the flowing amount (volume) of the helium gas with purity of a moderate level flowing via the piping 178, and exhausts the gas into the reticle stage system unit 154 and the wafer stage system unit 152 via the piping 180 and 181. And the helium gas with purity of a moderate level which circulates the reticle stage system unit 154 and the wafer stage system unit 152 is then supplied to the airflow volume control unit 184 via the respective piping 182 and 183. Then, the helium gas with purity of a moderate level exhausted from the airflow volume control unit 184 is returned to the first air conditioning control unit 162 via the piping 185, the second switching unit 175, and the piping 174. Thus, in this manner, the helium gas with purity of a moderate level supplied from the first air conditioning control unit 162 is circulated, and the reticle stage system unit 154 and the wafer stage system unit 152 are air-conditioned.

During this circulation, in the case the amount of helium gas having purity of a moderate level decreases, the first air conditioning control unit 162 fills the shortage by supplying the necessary amount of helium gas from the helium gas cylinder (not shown in Figures). That is, the air conditioning control unit 162 purges the shortage.

In addition, during the circulation of the helium gas having purity of a moderate level, the main controller 80 monitors the concentration of the helium gas of the gas used to air condition the reticle stage system unit 154 and the wafer stage system unit 152 in accordance with the concentration sensors 210B and 210D as is described previously. And, when the main controller 80 acknowledges that the concentration of the helium gas has fallen below the predetermined value set in advance, the main controller 80 then informs the first air conditioning control unit 162 and the third air conditioning control unit 166 of the fact.

On receiving the information, the third air conditioning control unit 166 opens the first air supply port. And the first air conditioning control unit 162 switches the direction switching valve (not shown in Figures) so as to internally create an exhausting path connected from the piping 174 to the piping 176. At the same time, the first air conditioning control unit 162 opens the second exhaust port, and sends the gas (helium gas having purity of a moderate level) used to air condition the reticle stage system unit 154 and the wafer stage system unit 152 being returned from the second switching unit 175 via the piping 174 to the third air conditioning control unit 166. Also, at the same time, the first air conditioning control unit 162 opens the first air supply port so as to take in the helium gas having purity of a moderate level supplied from the gas cylinder (not shown in Figures). And this helium gas is supplied to the reticle stage system unit 154 and the wafer stage system unit 152 via the first switching unit 173 and the air flow volume control unit 179 as fresh gas to air-condition the reticle stage system unit 154 and the wafer stage system unit 152.

That is, in this manner, the first air conditioning control unit 162 starts replacing the gas within the reticle stage system unit 154 and the wafer stage system unit 152. And while the gas is being replaced, the main controller 80 monitors the impurities concentration and the ozone concentration of the gas within the reticle stage system unit 154 and the wafer stage system unit 152 with the concentration sensors 210B and 210D. And, when the main controller 80 acknowledges that the gas replacement has been completed in the manner described previously, the main controller 80 then informs the completion to the first air conditioning control unit 162 and the third air conditioning control unit 166.

Upon receiving the information from the main controller 80, the third air conditioning control unit 166 closes the first air support port. And, the first air conditioning control unit 162, switches the direction switching valve (not shown in Figures) so as to internally create a circulating path connected between the piping 174 and the piping 172, as well as close the first air supply port to stop the supply of the helium gas.

The air conditioning using the helium gas with a high purity level supplied from the second air conditioning control unit 164 is performed as follows.

As is described previously, in a normal state, the first exhaust port and the third air supply port of the third air conditioning control unit 166 is in an "opened" state, whereas the other ports are in a "closed" state. And with the fourth switching unit 192, in a normal state, the air supply port and the first exhaust port is in an "opened" state, and the second exhaust port is in a "closed" state.

With the second air conditioning control unit 164, in a normal state, the first air supply port and the second exhaust port are in a "closed" state, whereas the second air supply port and the first exhaust port are in an "opened" state. And the second air conditioning control unit 164 adjusts the temperature and the flowing amount of the second gas (helium gas with a high purity level) returned from the illumination system unit 158 and the projection optical system unit 156 via the piping 191 and the fourth switching unit 192, then supplies it to the third switching unit 190 via the piping 189.

In a normal state, with the third switching unit 190, the first air supply port, the first exhaust port and the second exhaust port are in an "opened" state, and the second air supply port is in a "closed" state. The third switching unit 190 exhausts the helium gas with a high purity level coming from the second air conditioning control unit 164 via the piping 189, into the illumination system unit 158 via the piping 195, as well as supply the helium gas to the airflow volume control unit 197 via the piping 196.

With the airflow volume control unit 197, in a normal state, the air supply port and the second exhaust port are in an "opened" state, while the first exhaust port is in a "closed" state. The airflow volume control unit 197 adjusts the temperature and the flowing amount (volume) of the helium gas with a high purity level flowing via the piping 196, and supplies the gas to the airflow volume control unit 200 via the piping 199. With the airflow volume control unit 200, in a normal state, the air supply port and the first exhaust port is in a "opened" state, while the second exhaust port is in a "closed" state. And the airflow volume control unit 200 adjusts the temperature and the flowing amount of the helium gas with a high purity level flowing via the piping 199, and exhaust the gas into the projection optical system unit 156 via the piping 201.

As is described previously, the helium gas with a high purity level which is supplied to the illumination unit 158 and the projection optical system 156 and circulates these units, then is guided to the airflow volume control unit 205 via the piping 203 and 204. And the helium gas with a high purity level exhausted from the airflow volume control unit 205 is then returned to the second air conditioning control unit 164 via the piping 206, the fourth switching unit 192, and the piping 191. That is, in this manner, the helium gas with a high purity level, which is supplied from the second air conditioning control unit 164, is circulated and the air conditioning of the interior of the illumination unit 158 and projection optical system 156 is thus performed.

Meanwhile, upon exposure described earlier, according to the instructions from the main controller 80, the first exhaust port of the airflow volume control unit 197 and the second exhaust port of the airflow volume control unit 200 is opened. And from the airflow volume control unit 197 and the airflow volume control unit 200, the helium gas with a high purity level is exhausted into the reticle stage system unit 154 and wafer stage system unit 152 via the piping 198 and 202. That is, helium gas with a high purity level is supplied to units filled with helium gas with a moderate purity level. The helium gas exhausted, which has a high purity level, is used in the reticle stage system unit 154 to partially air condition the optical path of the reticle interferometer 74 or to keep the lens of the projection optical system PL arranged on the upper side portion from clouding. And within the wafer stage system unit 152, it is used to partially air condition the optical path of the wafer interferometer 146, partially air condition the optical path of the detection beam of the focus sensor AF, and to keep the lens of the projection optical system PL arranged on the lower side portion from clouding. In this sense, to effectively perform partial air conditioning of the respective portions described above, a path may be formed within the reticle stage system unit 154 and the wafer stage system unit 152. And this path may be used to supply the helium gas with a high purity level without fail to the respective portions described above. This path, maybe formed for example, by air curtains (using nitrogen gas or helium gas) or a tube-shaped member.

In this embodiment, partial air conditioning within the reticle stage system unit 154 and the wafer stage system unit 152 is performed, as is described above. And as a consequence, the measurement precision of the reticle interferometer 74, the wafer interferometer 146, and the focus sensor AF can be improved, as well as suppress the clouding of the projection optical system PL and the transmittance from decreasing.

During the circulation described above, in the case the amount of helium gas having a high purity level decreases, the second air conditioning control unit 164 fills the shortage by supplying the necessary amount of helium gas from the helium gas cylinder (not shown in Figures). That is, the air conditioning control unit 164 purges the shortage.

Also, during the circulation of the helium gas having a high purity level, the main controller 80 monitors the concentration of the helium gas of the gas used to air condition the illumination system unit 158 and the projection optical system unit 156 in accordance with the concentration sensors 210A and 210C as is described previously. And, when the main controller 80 acknowledges that the concentration of the helium gas has fallen below the predetermined value set in advance, the main controller 80 then informs the second air conditioning control unit 164 and the third air conditioning control unit 166 of the fact.

On receiving the information, the third air conditioning control unit 166 opens the second air supply port. And the second air conditioning control unit 164 switches the direction switching valve (not shown in Figures) so as to internally create an exhausting path connected from the piping 191 to the piping 193. At the same time, the second air conditioning control unit 164 opens the second exhaust port, and sends the gas (helium gas having a high purity level) used to air condition the illumination system unit 158 and the projection optical system unit 156 being returned from the fourth switching unit 192 via the piping 191 to the third air conditioning control unit 166. Also, at the same time, the second air conditioning control unit 164 opens the first air supply port so as to take in the helium gas having a high purity level supplied from the gas cylinder (not shown in Figures). And this helium gas is supplied likewise as before, this time to the illumination system unit 158 and the projection optical system unit 156 as fresh gas for air conditioning.

That is, in this manner, the second air conditioning control unit 164 starts replacing the gas within the illumination system unit 158 and the projection optical system unit 156. And while the gas is being replaced, the main controller 80 monitors the impurities concentration and the ozone concentration of the gas within the illumination system unit 158 and the projection optical system unit 156 with the concentration sensors 210A and 210C. And, when the main controller 80 acknowledges that the gas replacement has been completed in the manner described previously, the main controller 80 then informs the completion to the second air conditioning control unit 164 and the third air conditioning control unit 166.

Upon receiving the information from the main controller 80, the third air conditioning control unit 166 closes the second air support port. And, the second air conditioning control unit 164, switches the direction switching valve (not shown in Figures) so as to internally create a circulating path connected from the piping 191 to the piping 189, as well as close the first air supply port to stop the supply of the helium gas.

The air conditioning using the helium gas of a moderate purity level and the air conditioning using the helium gas of a high purity level, is performed at the same time in parallel, however, in the description above, for the sake of convenience, they are described separately.

The total air conditioning of the chamber 151 by the third air conditioning control unit 166 is described next.

At the initial state, the chamber 151 is to be filled with a helium gas (helium gas with a low purity level) which purity level is lower than the helium gas having purity of a moderate level described earlier.

In a normal state, the first exhaust port and the third air supply port of the third air conditioning control unit 166 are in an "opened" state, whereas the other ports are in a "closed" state. And the third air conditioning control unit 166 circulates the gas (helium gas with a low purity level) within the chamber 151, the piping 212 and 211 while adjusting the temperature and the flowing amount of the gas, so as to perform the overall air conditioning in the chamber 151. And, when the helium gas with a moderate purity level or the helium gas with a high purity level which concentration has fallen below the predetermined value is supplied to the chamber 151 by the first air conditioning control unit 162 or the second air conditioning control unit 164, this gas is circulated within the chamber 151 and overall air conditioning is performed.

While the overall air conditioning is performed within the chamber 151 with the gas including the helium gas described above being circulated, as is described previously, the main controller 80 monitors the concentration of the helium gas of the gas used for overall air conditioning. This monitoring is in accordance with the measurement value of the concentration detection sensor 215. And when the main controller 80 acknowledges that the concentration of the helium gas has fallen below the predetermined value set in advance, the main controller then informs, for example, the first air conditioning control unit 162 and the third air conditioning control unit 166 of the state.

Upon receiving this information, the third air conditioning control unit 166 opens the second exhaust port to exhaust the gas being returned via the piping 212 which helium gas concentration has declined, to the gas storing mechanism 214 as a gas for recycling. And when the first air conditioning control unit 162 receives the information, it begins to supply the helium gas with a moderate purity level which was being used for air conditioning to the third air conditioning control unit 166 in the manner described earlier. And at the same time, the first air conditioning control unit 162 takes in fresh helium gas of a moderate level from the first helium gas cylinder (not shown in Figures) to make up for the shortage of the helium gas. Furthermore, with the first air conditioning control unit 162 and the second air conditioning control unit 164, the helium gas supplied from the gas cylinder (not shown in Figures) also passes through the air filter, the chemical filter, the ozone removal filter, and the impurities removal filter. Therefore, absorptive gas which mixes due to trouble such as degas from the piping connecting the helium gas supplied from the gas cylinder (not shown in Figures) and the first and second air conditioning control unit 162 and 164, or gas leakage, can be removed.

Next, air conditioning operations during maintenance will be described.

When maintenance operation is being performed, the casing of not only the chamber 151 but also the air conditioning units except for the projection optical system unit 156 may be opened. Therefore, the following countermeasures are taken to avoid creating situations such as the operator inhaling the gas including the helium gas.

On maintenance operation, the first air conditioning control unit 162 the first exhaust port of the second switching unit 175 as well as open the second exhaust port in accordance with the instructions from the main controller 80. And, also at the same time, the first air conditioning control unit 162 closes the first air supply port of the first switching unit 173 and opens the second air supply port. The fourth air conditioning control unit 168, meanwhile, takes in the air within the clean room where the exposure apparatus is arranged via the piping 187. The air taken in is cleaned with the dust and small particles, organic contaminants, and ozone removed, by passing through the air filter, the chemical filter, and the ozone removal filter. And the fourth air conditioning control unit 168 then adjusts the temperature and the flowing amount of the cleaned air and supplies it to the first switching unit 173 via the piping 177. And the cleaned air is supplied from the first switching unit 173 via the airflow volume control unit 179 to the reticle stage system unit 154 and the wafer stage system unit 152. Thus, the operation of replacing the helium gas of a moderated level within the air conditioning unit to the cleaned gas begins.

Similarly, the second air conditioning control unit 164 closes the first exhaust port of the fourth switching unit 192 as well as open the second exhaust port in accordance with instructions from the main controller 80. And at the same time, the second air conditioning control unit 164 closes the first and air supply port and the second exhaust port of the third switching unit 190, as well as open the second air supply port, and close the second air supply port of the airflow volume control unit 205. And with the fifth air conditioning control unit 170, it takes in air, which is to be cleaned with the dust and small particles, organic contaminants, and ozone removed, bypassing through the air filter, the chemical filter, and the ozone removal filter. And the fifth air conditioning control unit 170 then adjusts the temperature and the flowing amount of the cleaned air and supplies it to the third switching unit 190 via the piping 194. And the cleaned air is supplied from the third switching unit 190 to the illumination system unit 158. Thus, the operation of replacing the helium gas of a high purity level within the illumination system unit 158 to the cleaned gas begins.

The reason for closing the second exhaust port of the third switching unit 190 and the second air supply port of the airflow volume control unit 205, is to keep the helium gas with a high purity level within the projection optical system 156. This is because the projection optical system PL does not require particular maintenance, and also because if the helium gas with a high purity level is replaced with air, it becomes the cause of the lens and the like which structure the projection optical system PL to cloud. From such viewpoints, an air conditioning path, which supplies helium gas with a high purity level at all times, may be separately arranged from the other air conditioning units within the projection optical system 156.

In addition, the third air conditioning control unit 166 opens the fourth air supply via the piping 216 in accordance with instructions from the main controller 80 and takes in air. The air, which is cleaned with the dust and small particles, organic contaminants, and ozone removed, by passing through the air filter, the chemical filter, and the ozone removal filter. And the third air conditioning control unit 166 then adjusts the temperature and the flowing amount of the cleaned air and supplies it to the chamber 151 via the piping 211. The third air conditioning control unit 166 also opens the second exhaust port and exhaust the gas returned via the piping 212 to the gas storing mechanism 214 via the piping 213. With this operation, the gas replacement of replacing the gas including the helium gas used to air condition the chamber 151 to air begins.

The gas replacement of the reticle stage system unit 154, the wafer stage system unit 152, illumination system unit 158, and the chamber 151 begins almost all at once. Furthermore, the main controller 80 measures the elapse of time after the gas replacement begins with a timer (not shown in Figures). And until a predetermined period of time has passed and the respective gas replacement have been completed, the main controller 80 does not display the approval to start the following operations or maintains the chamber 151 locked with its cover in a closed state. The main controller 80 may alternatively use the concentration sensors 210A, 210B, 210D, and 215 instead of measuring the elapsed time with the timer (not shown in Figures). In this case, the main controller 80 may not display the approval to start the following operations or may maintain the chamber 151 locked with its cover in a closed state, until the impurities concentration of the gas measured falls within the normal air level.

With the exposure apparatus in this embodiment, since the gas is replaced as described above, the gas supplied to the respective air conditioning units except for the projection optical system unit 156, is air which has been cleaned. Therefore, organic contaminants and dust and small particles do not adhere on the surface of the optical elements arranged on the optical path of the exposure light. Moreover, the projection optical system unit 156 is filled with helium gas having a high purity level which absorption index can be almost disregarded. So when the maintenance operation is completed, and moves onto exposure operation, helium gas need only to be supplied to air conditioning units other than the projection optical system unit, and exposure operation can be started swiftly.

For example, the optical cleaning operation to remove the organic contaminants adhered on the surface of the lens, which is performed after maintenance operation is completed, can be omitted.

With the exposure apparatus 10 in this embodiment, as can be easily imagined from FIG. 1, it comprises many column members such as the legs 30A to 30C and the struts 34A to 34D. Therefore, when dividing the adjacent air conditioning units using the pressure resistant sheet 160A, 160B, 160C and 160D, the attachment method of the pressure resistant sheet is devised.

Figure 11:
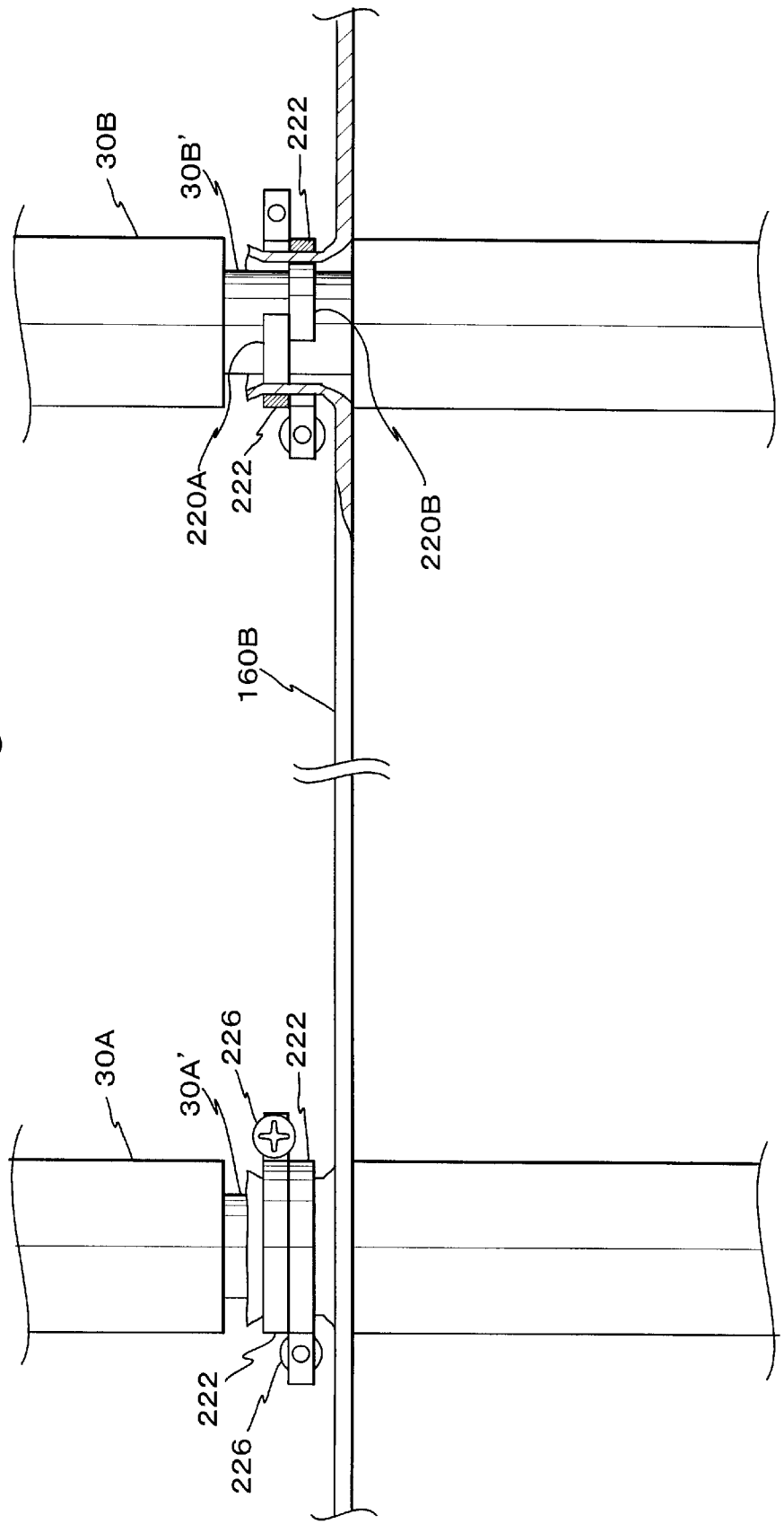
FIG. 11 is a partially sectional view showing the attachment arrangement when the pressure resistant sheet 160B which divides the reticle stage system unit and the projection optical system unit shown in FIG. 10 is attached to the column member.

FIG. 11 shows a partial sectional view of an example of the arrangement of the pressure resistant sheet 160B, which divides the reticle stage system unit 154 and the projection optical system unit 156, attached to the legs 30A to 30C (the leg 30C located in the depth of field of the drawing is not shown in Figures).

Figure 12:
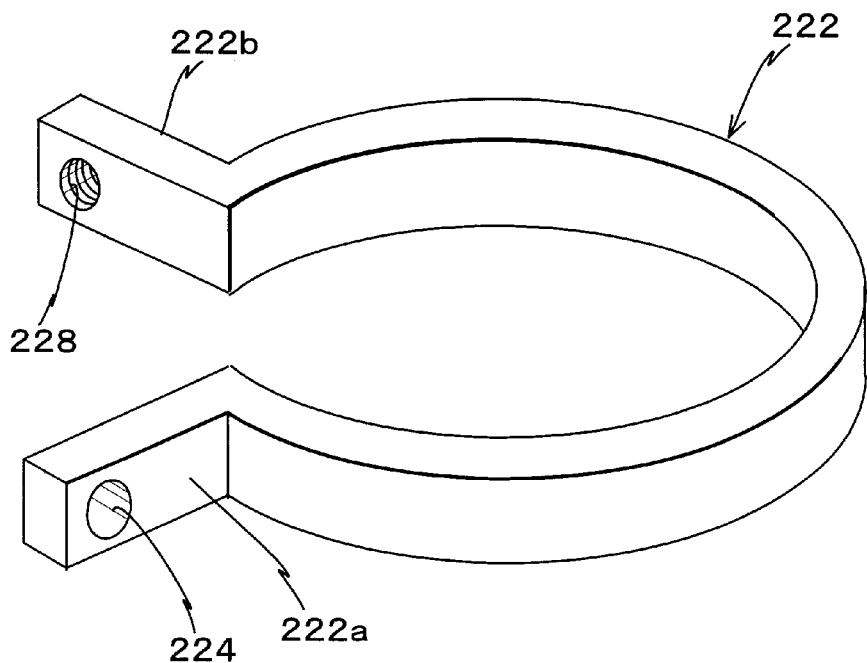
FIG. 12 is an enlarged perspective view of the metal fitting shown in FIG. 11.

As shown in FIG. 11, the pressure resistant sheet attachment portion on the leg 30A and 30B is a small diameter portion 30A' and 3GB' and the like, which are formed so as to have a circular shape (or an elliptical shape) in a sectional view. And on the peripheral portion of the small diameter portion 30A' and 30B', two C-shaped spacers 220A and 220B is alternately fitted. And from the outer side of the spacer 220A and 220B, so as to clamp the pressure resistant sheet 160B a metal fitting 222, shown enlarged in FIG. 12, is respectively inserted from the same direction in which the spacer 220A and 220B are fitted, in an alternate arrangement. And in the hole 224 formed on one of the projected portion 222a of the respective metal fittings 222, a screw 226 is inserted and screwed together into the screw hole 228 formed on the other projected portion 222b. And, by tightening the screw, the pressure resistant sheet 160B is gradually fixed to the leg 30A and 30B, and the like. That is, in this embodiment, the metal fitting 222 and the screw 226 make up a fastening mechanism that can be released.

In this case, the outer peripheral surface of the spacers 220A and 220B, and the inner peripheral surface of the metal fitting 222 is suppressed so that the surface does not exceed a predetermined roughness. Also, as is described earlier, the front and rear surface of the pressure resistant sheet 160B is formed of a chemically cleaned sheet. Therefore, even if the screw is tightened and the pressure resistant sheet 160B is fixed in the manner described above, degas from the contact portion of the pressure resistant sheet 160B, the spacer, and the metal fitting hardly occurs. Thus, contamination by gases that occurs from fixing the pressure resistant sheet 160B to the legs, can be prevented.

Also, the vicinity of the respective opening edges of the C-shaped spacer 220A and spacer 220B are, as shown in FIG. 11, in close contact, therefore, gas leakage can be prevented almost without fail.

The pressure resistant sheet 160B is fixed to other column members (for example struts 34A to 34D), similarly as described above. Furthermore, in the case of using the fastening mechanism on the illumination system housing, the object surface side of the projection optical system, and the image surface side, C-shaped spacers and metal fittings corresponding to these sizes are to be arranged.

With this embodiment, the pressure resistant sheet 160B is fixed as described above to both the legs 30A to 30C which structure a portion of the main column (the first unit) 12 in FIG. 1, and the struts 34A to 34D which structure a portion of the second unit 14. In addition, the pressure resistant sheet 160B is fixed to the object surface side of the projection optical system in the same manner as when it is fixed to the legs 30A to 30C and the struts 34A to 34D. So the vibration generated on the second unit side may travel to the main column 12 side and the projection optical system PL side via the pressure resistant sheet 160B. In consideration of these points, the pressure resistant sheet 160B is arranged to have a predetermined amount of flexure. Therefore, in the case the pressure resistant sheet 160B is deformed corresponding to the relative positional change between the main column 12 and the second unit 14, it does not to interfere with the relative positional change. Also, the vibration generated on the second unit 14 side can be effectively prevented from travelling to the main column 12 and the projection optical system PL side via the pressure resistant sheet 160B. Furthermore, the pressure resistant sheet 160B, which is arranged between the projection optical system PL and the legs 30A to 30C, may be arranged so as to have a predetermined amount of flexure.

In addition, the pressure resistant sheet is similarly attached to the image plane side of the projection optical system, and the illumination housing.

Also, by unscrewing the screw 226, the metal fitting 222 can be taken off, and the pressure resistant sheet 160B can be easily detached. This in turn can improve the work efficiency of during the maintenance operation when compared to the case where the partition material to divide the air conditioning units is fixed.

The other pressure resistant sheets 160A, 160C, and 160D are also affixed to the column members in a similar manner as is described above, and also come up with the same effects.

With the exposure apparatus in this embodiment that has been described in detail, various effects such as the ones described below can be obtained.

Within the projection optical system unit 156 and the illumination system unit 158 that include the optical system, the gaseous portion where the illumination light flux passes through is large. Therefore, the absorption of the illumination eight needs to be suppressed as much as possible, as well as perform a chemically clean air conditioning. Whereas, with the wafer stage system unit 152 and the reticle stage system unit 154 that include the stage system, the gaseous portion where the illumination light flux passes through is small. Therefore, the wafer stage system unit 152 and the reticle stage system unit 154 only require a degree of chemical cleanliness which does not deteriorate the measurement accuracy of the interferometer measuring the respective stage positions. However, within the wafer stage system unit 152 and the reticle stage system unit 154, a certain amount of gas flow is required in order to prevent dust from depositing on the wafer and the reticle. Accordingly, the performance required for air conditioning differs between the wafer stage system unit 152, the reticle stage system unit 154, and the projection optical system unit 156, the illumination system 158.

Therefore, with the exposure apparatus in this embodiment, as is previously described, the first air conditioning control unit 162 air conditions the wafer stage system unit 152 and the reticle stage system unit 154 by supplying helium gas with purity of a moderate level serving as the first gas. And the second air conditioning control unit 164 air conditions the projection optical system unit 156 and the illumination system unit 158 by supplying helium gas with purity of a high level serving as the second gas. As a consequence, with the first air conditioning control unit 162 and the second air conditioning control unit 164, the airflow amount and the contamination can be controlled independently by using gases, which comply with to the performance required for air conditioning. Accordingly, various ideal controls can be performed independently, thus the transmittance of the optical system can be kept from deteriorating, and dust and small particles can also be kept from adhering onto the optical system.

The reason for using the helium gas with purity of a high level as the second gas, and helium gas with purity of a moderate level as the first gas, is since the second gas is supplied to the space within the optical system such as in the illumination optical system IOP and the projection optical system PL, an inert gas having high purity is required to prevent the degree of contamination from worsening by air conditioning. Whereas, with stage portions where the maintenance frequency or the reticle and the wafer exchanging frequency is high, although the contamination needs to be removed by using chemical filters, the first gas supplied to these portions only require a degree of chemical cleanliness which does not deteriorate the measurement accuracy of the interferometers, accordingly do not require a higher purity.

With the exposure apparatus in this embodiment, when the concentration of the helium gas in the gas used to air-condition a particular unit within the air conditioning units 152, 154, 156, and 158 falls under there spective threshold values, it is detected by the main controller 80 based on the output of the first concentration sensors 210A to 210D. And the air conditioning control unit corresponding to the particular unit (either of the first air conditioning control unit 162 or the second air conditioning control unit 164) sends fresh gas for air conditioning the unit, as well as exhaust the gas used to the third air conditioning control unit 166 so as to be used for total air conditioning of the chamber 151. Thus, the third air conditioning control unit 166 uses the gas which was used to air condition the particular unit, to air condition the chamber 151. For this reason, the interior of the air conditioning units 152, 154, 156, and 158 does not have to be maintained at a positive pressure, since the gas flowing into the units for even the slightest amount is helium gas, and compared with the case of using $N_2$ or dry air for the total air conditioning, the purity of the helium gas used to air condition the air conditioning units 152, 154, 156, and 158 can be kept from deteriorating for a much longer period of time. That is, in this embodiment, the space where the helium gas is filled can be made up of a double structure, and as a consequence, can suppress the amount of helium gas supplied.

In addition, with this embodiment, the helium gas used to air condition the air conditioning units 152, 154, 156, and 158 which purity has deceased is sent to the chamber 151, and the gas is used to air condition the chamber 151. And when the purity of helium gas falls under a predetermined concentration, it is detected by the main controller 80 based on the output of the second concentration sensor 215. Then the third air conditioning control unit 166 exhausts the gas used to air condition the chamber 151 into the gas storing mechanism 214. In this manner, the gas for air conditioning which purity level has decreased and has been used for air conditioning is stored within the gas storing mechanism 214, without exhausting it externally. Therefore, the environment can be kept from being polluted, as well as can prevent the worker from inhaling the gas during operation. Also, the gas stored it the gas storing mechanism 214 is recycled, therefore leads to a reduction in cost.

In addition, the first concentration sensor 210A to 210D include the impurities concentration sensor and the ozone sensor. Therefore, when the measurement value of at least either of the sensors exceed the predetermined permissive amount, the main controller 80 can detect that the concentration of helium gas in the gas used to air condition the air conditioning units 152, 154, 156, and 158 has fallen under the predetermined concentration value. Also, since the second concentration sensor 215 includes the impurities concentration sensor and the ozone sensor. Therefore, when the measurement value of at least either of the sensors exceed the predetermined permissive amount, the main controller 80 can detect that the concentration of helium gas in the gas used to air condition the chamber 151 has fallen under the predetermined concentration value.

Also, with this embodiment, between the adjacent air conditioning units, to be more specific, between the illumination system unit 158 and the reticle stage system unit 154, between the reticle stage system unit 154 and the projection optical system unit 156, the projection optical system unit 156 and the wafer stage system unit 152 is partitioned by the pressure resistant sheet 160A, 160B, 160C and 160D, respectively formed of the pressure resistant sheet itself and the sheet member being chemically cleaned which covers the pressure resistant sheet, making up a double structure (three layer structure). Therefore, the degree of chemical cleanliness of each air conditioning unit can be kept from decreasing, as well as independently replace the gas within each unit with air (atmosphere), thus extremely improving the work efficiency during maintenance operations.

In addition, with the exposure apparatus in this embodiment, the main column 12 which includes the reticle base supporting bed 32 and the wafer base supporting bed 28 movably supporting the reticle stage RST and wafer stage WST, is supported by the three vibration isolation units 18A to 18C. And, the driving unit 82 of the reticle stage RST and the driving unit 84 of the wafer stage WST is supported by the struts 34A to 34D which make up the second unit 14, independent in respect to vibration from the main column 12. Also, the XY direction fine-driving reticle frame 48 and the reticle stage RST which make up the driving unit 82 of the reticle stage RST is connected with the plate spring 46, which rigidity in the moving surface direction (X, Y, and θz) of the reticle stage RST is higher than that of the direction perpendicular to the moving surface direction (Z, θx, and θy). And, the XY direction moving unit 94 and the wafer stage WST which make up the driving unit 84 of the wafer stage WST is connected with the plate spring 118, which rigidity in the moving surface direction (X, Y, and θz) of the XY stage 120 is higher than that of the direction perpendicular to the moving surface direction (Z, θx, and θy).

Therefore, for example, when the reticle stage RST is driven, the reaction force acting on the struts 34A to 34D supporting the driving unit 82 hardly travels to the reticle base supporting bed 32. Similarly when the wafer stage WST is driven, the reaction force acting on the struts 34A to 34D supporting the driving unit 84 hardly travels to the wafer base supporting bed 28. Thus, the main column 12 including the reticle base supporting bed 32 and the wafer base supporting bed 28 is hardly affected by vibration, or distorted by the vibration.

In addition, since the plate springs 46 and 118 have a higher rigidity in the moving surface direction of the respective stages, the respective driving units can easily drive the stages via the plate springs. Also, since the reticle stage RST and its driving unit 82, the wafer stage unit WST and its driving unit 84 are arranged separately, the respective stages can be downsized and the weight can be reduced, as well as reduce the offset load which acts on the reticle base supporting bed 32 and the wafer base supporting bed 28 with the respective movement of the stages.

In addition, since the rigidity of the plate springs 46 and 118 is low in the direction perpendicular to the moving surface of the stages, if the wafer base supporting bed 28 and the reticle base supporting bed 32 are tilted in respect to the base plate BP due to for example the offset load occurring when driving the stage, the wafer stage WST and the reticle stage RST follows this movement. However, when this happens, the plate springs 118 and 46 deforms so that they allow the change in posture of the wafer stage WST and reticle stage RST. And as a consequence, the structuring portion of the driving units connected to each stages by the plate springs (XY direction moving unit 94 and the XY direction fine-driving reticle frame 48) maintains the original posture. Accordingly, with this embodiment, although this embodiment employs the suspending type wafer base supporting bed, and each stage and its driving unit is arranged separately, inconvenience such as the guide of the driving unit biting, can be prevented, and exceeds in vibration isolation and positional controllability of the stage. Particularly, with the wafer stage WST side, as a consequence, focus leveling control becomes easier.

In addition, with this embodiment, the exposure apparatus comprises reaction force cancellation actuators 122A to 122D and 123A to 123D which provide a counter-force to cancel the reaction force acting on the second unit 14 (to be more specific, struts 34A to 34D), and the main controller 80 feed-forward controls these actuators. Therefore, vibration can be suppressed with not only the main column 12, but also the second unit 14, moreover, since the reaction force cancellation actuators provides the counter-force to the second unit 14 without delay, the reaction force in the second unit 14 can be cancelled almost at the same time it is generated.

In addition, the pressure resistant sheet 160A, 160B, 160C and 160D that divide the illumination system unit 158 and the reticle stage system unit 154, between the reticle stage system unit 154 and the projection optical system unit 156, the projection optical system unit 156 and the wafer stage system unit 152, expands or contracts in accordance with the relative positional change between the main column 12 and the second unit 14. Therefore, the pressure resistant sheet 160A, 160B, 160C and 160D do not interfere the relative positional change occurring between the main column 12 and the second unit 14, and vibration does not travel between the main column 12 and the second unit 14. Accordingly, the vibration on the second unit 14 side which supports the driving units of the wafer stage WST and reticle stage RST can be kept from being the direct cause of vibration on the main column side, which supports the projection optical system and the like, as well as can partition the respective air conditioning units by the pressure resistant sheet 160A, 160B, 160C and 160D.

Also, with the exposure apparatus in this embodiment, for example, during the normal operations described earlier, the main controller 80 monitors the helium gas concentration of the gas used to air condition the reticle stage system unit 154 and the wafer stage system unit 152 in accordance with the measurement values of the concentration sensors 210B and 210D. And when the main controller 80 detects that the concentration has fallen below the predetermined value that has been set in advance, the main controller 80 notifies the situation to the first air conditioning control unit 162 and the third air conditioning control unit 166. Then the first air conditioning control unit 162 supplies helium gas with purity of a moderate level to the wafer stage system unit 152 and the reticle stage system unit 154, and the interior gas is replaced. During this operation, the stage control unit 81 may respectively drive the wafer stage and the reticle stage in accordance with the instructions from the main controller 80. With this operation, in the case of replacing the gas within the reticle stage system unit 154 and the wafer stage system unit 152 where the frequency of maintenance is high, the stage control unit 81 drives the stages while replacing the gas, therefore, by driving the stage the gas is more positively dispersed, which allows a higher gas replacement speed.

Moreover, when performing gas replacement to restore the original atmosphere of the air conditioning units 152, 154, 156, and 158 after power failure, power shutdown, or moving the exposure apparatus, and the like, the gas in each unit can be exhausted by applying a predetermined constant degree of vacuum which the pressure resistant sheet 160A to 160D can tolerate. Then the process to supply the gas for air conditioning into each unit can be repeatedly performed, and the gas can be replaced.

In addition, in this embodiment, as is described above, the gas replacement efficiency is improved by creating a vacuumed state in each unit during replacement, however, in the case time can be spent on gas replacement, a vacuumed state does not necessarily have to be created in each unit. For example, the gas within the respective air conditioning units may be replaced with nitrogen gas ($N_2$ gas), and then further replaced with helium gas (He), or the gas within the respective air conditioning units may gradually be replaced with helium gas. In this case, the pressure resistant sheet 160A to 160D may of course be used. However, instead of the pressure resistant sheets, a sheet member (a metal leaf itself, or a sheet member having the metal leaf plated on the surface) comprising a metal leaf (a thin metal sheet, usually below 0.15 mm), or a sheet member made of soft plastic with metal vaporized which is chemically clean can be used. These sheet members excel in suppressing vibration from travelling compared with the pressure resistant sheet 160A to 160D. And also in the case of using such sheet members, by allowing flexure of the sheet members or by fixing it loosely to the column members, it becomes possible to further cope with three dimensional vibration.

In addition, although it is not described in particular so far, with the exposure apparatus in this embodiment, the second air conditioning control unit 164 can be operated by a secondary power supply. So when the power of the exposure apparatus is switched off, the secondary power supply starts to operate and stops the internal gas of the projection optical system unit 156 and the illumination system unit 158 from flowing out, as well as supply a small amount of helium gas which has a high purity level to both units. Therefore, a state in which the helium gas having a high purity level is purged can be maintained at all times in the projection optical system PL and the illumination optical system IOP where the maintenance frequency is low and do not have much driving portions. And as a consequence, when starting up the operation of the apparatus, the frequency of having to create a vacuumed state greatly decreases, and this in turn relieves the apparatus from unnecessary stress, as well as reduce the start up time.

Furthermore, with the exposure apparatus in this embodiment, the yawing (θz rotation) of the wafer stage WST can be corrected without fail, since the driving unit which drives the stage in the X-axis direction being the non-scanning direction has a first X linear motor 104A and a second X linear motor 104B, and the stage control unit 81 controls the thrust distribution factor of the first X linear motor 104A and the second X linear motor 104B in accordance with the detection results of the wafer laser interferometer system 146.

In addition, since the XY direction moving unit 94 is included in the driving unit 84 of the wafer stage WST, the arrangement of the wafer stage can be simplified, thus can downsize the wafer stage as well as reduce its weight. For similar reasons, the reticle stage RST can also be downsized, as well as its weight reduced.

Also, since the plate spring 118 is arranged line symmetric in respect to the center of gravity of the wafer stage WST, it is not the cause of the rotation moment working to generate pitching and rolling to the wafer stage WST. The same can be said for the reticle stage RST.

In addition, as can be seen from FIG. 4 and FIG. 2, the wafer base supporting bed 28 and the reticle base supporting bed 32 are respectively supported by three points by the supporting bed suspending member 26 and the legs 30A to 30C in the vicinity of each apex of the triangle. And the driving unit 84 of the wafer stage WST and the driving unit 82 of the reticle stage RST are supported by the struts 34A to 34D arranged on four points at each rectangular angle, which almost overlap the triangle. Therefore, since the supporting bed suspending member 26 and the legs 30A to 30C and the struts 34A to 34D fit into each other, the space efficiency can be maintained, and can avoid the footprint from increasing.

In addition, each interferometer which make up the wafer laser interferometer system 146 and the reticle laser interferometer 74 that measures the position of the wafer stage WST and reticle stage RST, are supported by the vibration isolation unit 18A to 18C. And as is described earlier, they are fixed to the main column 12 which vibration and distortion and the like are effectively suppressed, and the position of the respective stages are measured with the projection optical system PL (the fixed mirror fixed to the projection optical system) which is supported by the main column 12 as the reference. Therefore, the measurement errors of the interferometers are extremely small, and it becomes possible to measure the position of the respective stages with high precision.

Also, with this embodiment, the edge surface of the pair of sampling mount supporting rods 132 which make up the three sampling mount supporting units 136A to 136C arranged on the XY stage 120, are arranged almost flush with the upper surface of the sampling mount 138. The edge surface of the pair of sampling mount supporting rods 132 and the upper surface of the sampling mount 138 is connected to the XY stage 120 (wafer stage WST) with the plate springs 142A to 142C which rigidity in the moving surface direction, is higher than the direction perpendicular to the moving surface direction. And the three voice coil motors that make up the three sampling mount supporting units 136A to 136C drives the sampling mount 138 in the Z tilt direction. So, the Z direction tilt of the sampling mount 138 can be precisely driven with the wafer base supporting bed 28 as the reference surface by the voice coil motor 134, without hardly being affected by the reaction force of the wafer stage WST being driven in the moving surface.

In addition, the stress occurring on the stage portion due to the deformation of the plate spring 118 can be absorbed by the plate springs 142A to 142C. Therefore, distortion occurring to the sampling mount 138 can be effectively suppressed, and the deformation of the reflection surface formed on the side surface can also be suppressed. In this sense, the precision of the positional measurement of the wafer stage WST can be improved.

With the exposure apparatus 10, with the effective methods devised as described above, in the case of using the $F_2$ laser beam or the vacuum ultraviolet light which has a shorter wavelength than the $F_2$ laser beam, from the viewpoint of the chemical cleanliness and the transmittance of the exposure illumination light, exhibits high performance. Also, the vibration and reactance of each portion of the apparatus is reduced, as well as the positional controllability of the stages improved. The synchronous settling time of both stages is also reduced, which leads to an increase in throughput, and the positional shift of the pattern transferred or the image blur and the like which occur due to the vibration of the projection optical system PL can be effectively prevented, and the exposure accuracy can be improved.

Furthermore, in the embodiment above, the case has been described where the inert gas used to air condition the air conditioning units 152, 154, 156, 158, and the chamber 151 is helium gas. However, the present invention is not limited to this. That is, the inert gas used maybe, Neon, Argon, Krypton, Xenon, and the like. In the embodiment above, the case has been described where the gas used to air condition the chamber 151 is the helium gas which purity has decreased while being used to air condition the illumination system unit 158 and the projection optical system 156. However, if the purity of the helium gas used to air condition the illumination system unit 158 and the projection optical system 156 is within the permissive range of the helium gas used to air condition the reticle stage system unit 154 or the wafer stage system unit 152, the helium gas used to air condition the illumination system unit 158 and the projection optical system 156 may be supplied to the reticle stage system unit 154 or the wafer stage system unit 152.

In addition, with the embodiment above, the case has been described where helium gas is used as the first gas and the second gas, however, nitrogen gas may also be used.

Furthermore, in the embodiment above, the case has been described where helium gas with a low (moderate) purity level is used as the first gas, and as the second gas helium gas with high purity level is used. However, the type of gas may differ. For example, Nitrogen gas may be used as the first gas, whereas helium gas may be used as the second gas. Also, with the embodiment above, the case has been described where helium gas is supplied to the whole illumination system unit, however, within the illumination system where the optical path length is short, nitrogen with high purity may be supplied.

In addition, with the exposure apparatus in this embodiment, the bearing is not limited to air-static bearings, and magnetic bearings may be used.

Furthermore, in this embodiment, as the light source, a $F_2$ laser light source, a $Kr_2$ laser light source, or an $Ar_2$ laser light source is used. However, the present invention is not limited to this, and an ArF excimer laser light source may be used which emits vacuum ultraviolet light with a wavelength of 193 nm.

Also, for example, with an exposure apparatus likewise with the embodiment described above using ultraviolet light as the illumination light, the projection optical system may be a reflection/refraction system (catadioptric system) including reflection optical elements and refraction optical elements. In this case, as a reflection/refraction type projection optical system, a reflection/refraction system having a beam splitter and concave mirror as reflection optical elements, which is disclosed in detail in, for example, Japanese Patent Laid Open No. 08-171054 and the corresponding U.S. Pat. No. 5,668,672, Japanese Patent Laid Open No. 10-20195 and the corresponding U.S. Pat. No. 5,835,275 can be used. Or, a reflection/refraction system having a concave mirror and the like as reflection optical elements without using any beam splitter, which his disclosed in detail in, for example, Japanese Patent Laid Open No. 08-334695 and the corresponding U.S. Pat. No. 5,689,377, Japanese Patent Laid Open No. 10-3039 and the corresponding U.S. patent application Ser. No. 873,605 (application date: Jun. 12, 1997). The disclosures cited above are fully incorporated herein by reference.

Alternatively, a reflection/refraction system in which a plurality of refracting optical elements and two mirrors (a concave mirror serving as a main mirror, and a sub-mirror serving as a back-mirror forming a reflection plane on the side opposite to the incident plane of a refracting element or a parallel flat plate) may be used. The two mirrors are arranged on an axis, and an intermediate image of the reticle patternformedbythepluralityof refracting optical elements is re-formed on the wafer by the main mirror and the sub-mirror, as disclosed in Japanese Patent Laid Open No. 10-104513 and the corresponding U.S. Pat. No. 5,488,229. In this reflection/refraction system, the main mirror and the sub-mirror are arranged in succession to the plurality of refracting optical elements, and the illumination light passes through a part of the main mirror and is reflected on the sub-mirror and then the main mirror. It then proceeds further through a part of the sub-mirror and reaches the wafer. The disclosures cited above are fully incorporated herein by reference.

Furthermore, as a reflection/refraction type projection optical system a reduction system can be used which projection magnification is 1/4 or 1/5, has a circular image field, and is double telecentric on both the object plane side and image plane side. In the case of a scanning exposure apparatus comprising this reflection/refraction type projection optical system, the irradiation area of the illumination light can be in the field of the projection optical system having the optical axis of the projection optical system roughly as the center, and be determined in a rectangular slit shape extending in the direction almost perpendicular to the scanning direction of the reticle or the wafer. With the scanning exposure apparatus comprising such a reflection/refraction type projection optical system, even, for example, in the case of using an $F_2$ laser beam having a wavelength of 157 nm as the illumination light for exposure, a fine pattern of around a 100 nm L/S pattern can be transferred with high precision onto the wafer.

In addition to using an ArF excimer laser beam or an $F_2$ laser beam as vacuum ultraviolet light, a harmonic may be used. This harmonic, is obtained by amplifying a single-wavelength laser beam in the infrared or visible range being emitted by a DFB semiconductor laser or fiber laser with a fiber amplifier doped with erbium (or both erbium and ytteribium), and converting the wavelength into ultraviolet light using a nonlinear optical crystal.

If, for example, the oscillation wavelength of a single-wavelength laser is set within the range of 1.51 to 1.59 μm, an eighth-harmonics whose generation wavelength falls within the range of 189 to 199 nm or a tenth-harmonics whose generation wavelength falls within the range of 151 to 159 nm is output. If the oscillation wavelength is set in the range of 1.544 to 1.553 μm, in particular, an eighth-harmonics whose generation wavelength falls within the range of 193 to 194 nm, i.e., ultraviolet light having almost the same wavelength as that of an ArF excimer laser beam, can be obtained. If the oscillation wavelength is set within the range of 1.57 to 1.58 μm, a tenth-harmonics whose generation wavelength falls within the range of 157 to 158 nm, i.e., ultraviolet light having almost the same wavelength as that of an $F_2$ laser beam, can be obtained.

If the oscillation wavelength is set within the range of 1.03 to 1.12 μm, a seventh-harmonics whose generation wavelength falls within the range of 147 to 160 nm is output. If the oscillation wavelength is set within the range of 1.099 to 1.106 μm, in particular, a seventh-harmonics whose generation wavelength falls within the range of 157 to 158 μm, i.e., ultraviolet light having almost the same wavelength as that of an $F_2$ laser beam, can be obtained. In this case, as a single-wavelength oscillation laser, for example, an ytteribium-doped fiber laser can be used.

Furthermore, the present invention can be applied to not only an exposure apparatus manufacturing microdevices such as a semiconductor element but also to an exposure apparatus for transferring a circuit pattern onto a glass substrate, silicon wafer, or the like to manufacture a reticle or mask. The reticle and mask are used in an apparatus such as an optical exposure apparatus, an EUV exposure apparatus, an X-ray exposure apparatus, an electron beam exposure apparatus, and the like. With the exposure apparatus using light such as DUV (deep ultraviolet) light or VUV (vacuum ultraviolet) light, a transmission type reticle is used in general, and as the reticle substrate material such as fused silica, fluorine doped silica glass, fluorite, magnesium fluoride, or crystal may be used. Also, with the X-ray exposure apparatus based on the proximity method or an electron beam exposure apparatus, the transmission type mask (stencil mask, membrane mask) is used, and as the mask substrate material such as silicon wafer is used.

The present invention can be suitably applied, as a matter of course, to an exposure apparatus to transfer a device pattern onto a glass plate used to manufacture a display such as a liquid crystal display, to transfer a device pattern onto a ceramic wafer used to manufacture thin-film magnetic heads, and an exposure apparatus used to manufacture image sensing devices (CCDs and the like).

Furthermore, with the embodiment above, the case has been described where the present invention has been applied to a scanning stepper. However, the present invention may also be applied to the substrate stage portion of a reduction projection exposure apparatus based on the step and repeat method, which transfers the pattern formed on the mask onto the substrate in a static state, then sequentially steps the substrate. In such a case, the present invention can also exhibit high performance in the aspects of the degree of chemical cleanliness and the transmittance to the illumination light for exposure, therefore, exposure with high precision becomes possible.

In addition, with the exposure apparatus related to the present invention, in the case of using a linear motor for the wafer stage or the reticle stage (details are disclosed in, U.S. Pat. No. 5,623,853 and U.S. Pat. No. 5,528,118 for reference), the linear motor is not limited to an air levitation type by air bearings. A magnetic levitation type by the Lorentz force or a reactance force may also be used.

The exposure apparatus in the embodiment above can be made by incorporating the illumination optical system made up of a plurality of lenses and the projection optical system into the main column, performing optical adjustment, while incorporating the reticle stage or wafer stage that are made up of various mechanical components into the main column, and connecting the wiring and piping, and furthermore, performing total adjustment (electrical adjustment, operational adjustment). The exposure apparatus is preferably made in a clean room in which temperature, degree of cleanliness, and the like are controlled.

In addition, a semiconductor device is manufactured through the following steps: the step of designing the function and performance of the device; the step of manufacturing a reticle on the basis of the design step; the step of manufacturing a wafer from a silicon material; the step of transferring a reticle pattern onto the wafer by using the exposure apparatus of the above embodiment; the step of assembling the device (including dicing, bonding, and packaging process), the inspection step, and the like.

Device Manufacturing Method

A device manufacturing method using the lithographic system (exposure apparatus) and the exposure method as described above in a lithographic process will be described next in detail.

Figure 13:
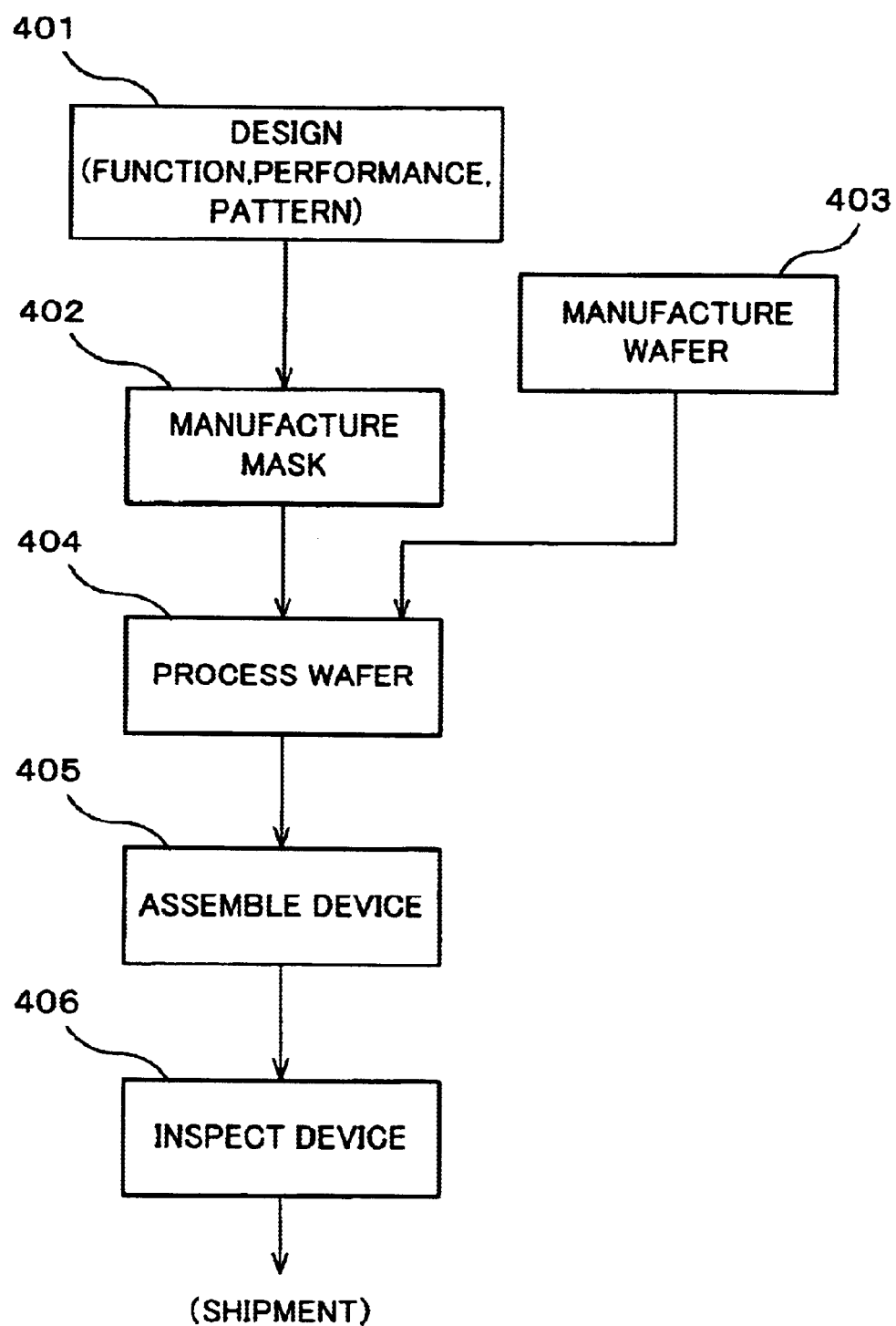
FIG. 13 is a flow chart for explaining an embodiment of a device manufacturing method according to the present invention.

FIG. 13 is a flow chart showing an example of manufacturing a device (a semiconductor chip such as an IC or LSI, a liquid crystal panel, a CCD, a thin magnetic head, a micromachine, or the like). As shown in FIG. 13, in step 401 (design step), function/performance is designed for a device (e.g., circuit design for a semiconductor device) and a pattern to implement the function is designed. In step 402 (mask manufacturing step), a mask on which the designed circuit pattern is formed is manufactured. In step 403 (wafer manufacturing step), a wafer is manufacturing by using a silicon material or the like.

In step 404 (wafer processing step), an actual circuit and the like are formed on the wafer by lithography or the like using the mask and wafer prepared in steps 401 to 403, as will be described later. In step 405 (device assembly step), a device is assembled by using the wafer processed in step 404. Step 405 includes processes such as dicing, bonding, and packaging (chip encapsulation).

Finally, in step 406 (inspection step), a test on the operation of the device, durability test, and the like are performed. After these steps, the device is completed and shipped out.

Figure 14:
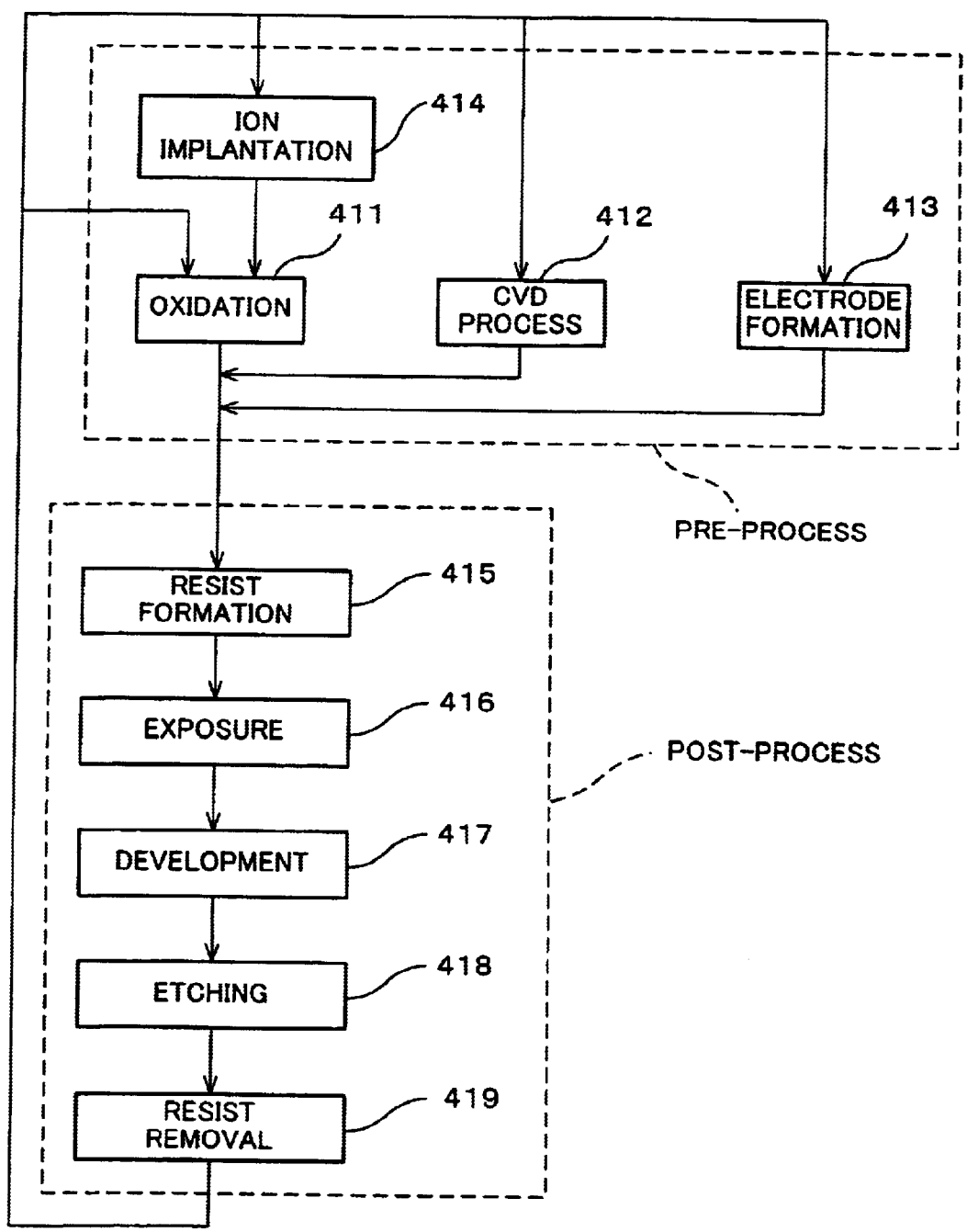
FIG. 14 is a flow chart showing the processing in step 404 in FIG. 13.

FIG. 14 is a flow chart showing a detailed example of step 404 described above in manufacturing the semiconductor device. Referring to FIG. 14, in step 411 (oxidation step), the surface of the wafer is oxidized. In step 412 (CVD step), an insulating film is formed on the wafer surface. In step 413 (electrode formation step), an electrode is formed on the wafer by vapor deposition. In step 414 (ion implantation step), ions are implanted into the wafer. Steps 411 to 414 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 415 (resist formation step), the wafer is coated with a photosensitive agent. Next, as in step 416, the circuit pattern on the mask is transcribed onto the wafer by the above exposure apparatus and method. Then, in step 417 (developing step), the exposed wafer is developed. In step 418 (etching step), an exposed member on a portion other than a portion where the resist is left is removed by etching. Finally, in step 419 (resist removing step), the unnecessary resist after the etching is removed.

By repeatedly performing these pre-process and post-process, multiple circuit patterns are formed on the wafer.

As described above, by using the device manufacturing method of this embodiment, the exposure apparatus and exposure method described in the embodiment above are used in the exposure process (step 416) This makes it possible for the exposure apparatus to exhibit high performance in the aspects of the degree of chemical cleanliness and the transmittance to the illumination light for exposure. Also, the vibration and reactance of each portion of the apparatus is reduced, as well as the positional controllability of the stages improved. The synchronous settling time of both stages is reduced, leading to an increase in throughput, and the positional shift of the pattern transferred or the image blur and the like which occur due to the vibration of the projection optical system PL can be effectively prevented, and the exposure accuracy can be improved. Accordingly, the productivity (including yield) of highly integrated devices can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus which performs exposure on a substrate with illumination light from a light source, said exposure apparatus comprising:

at least one of a first room arranged on an optical path between said light source and said substrate, said first room having a short optical path of said illumination light passing through and a predetermined level of chemical cleanliness degree;

at least one of a second room arranged on said optical path, said second room having a longer optical path of said illumination light passing through and a higher degree of chemical cleanliness compared with said first room;

a first gas conditioning control unit that is provided with said first room and supplies a first gas to said first room; and a second gas conditioning control unit that is provided with said second room and supplies a second gas to said second room.

2. An exposure apparatus according to claim 1, wherein said second gas is an inert gas with high purity level, and said first gas is an inert gas which purity level is lower than said second gas.

3. An exposure apparatus according to claim 1, said exposure apparatus further comprising:

a third room which houses said first room and said second type room; and a third gas conditioning control unit that is provided with said third room and supplies a third gas to said third room.

4. An exposure apparatus according to claim 3, wherein said second gas is an inert gas with high purity level, and said first gas is an inert gas which purity level is lower than said second gas, and said third gas is a gas including said inert gas which purity level is lower than that of said first gas.

5. An exposure apparatus according to claim 1, wherein said exposure apparatus comprises a main body of said exposure apparatus, which includes an illumination optical system illuminating said mask with said illumination light, a mask stage which holds said mask, a projection optical system projecting said illumination light outgoing from said mask to said substrate, and a substrate stage which holds said substrate, and said first room is at least one of a first gas conditioning room which includes an edge surface of an image plane side of said projection optical system, said substrate stage and its driving unit, and a second gas conditioning room which includes an edge surface of an object surface side of said projection optical system, said mask stage and its driving unit, and said second room is at least one of a third gas conditioning room which includes said projection optical system and a fourth gas conditioning room which includes said illumination optical system.

6. An exposure apparatus according to claim 5, said exposure apparatus further comprising:

a stage control unit which drives at least one of said substrate stage and said mask stage housed in said first room, when said first gas conditioning control unit supplies said first gas to said first room and replaces internal gas.

7. An exposure apparatus according to claim 5, wherein said second gas conditioning control unit can operate by a secondary power supply, said second gas conditioning control unit starts to operate by said secondary power supply to stop the internal gas of said second room from flowing out as well as to supply an extremely small amount of said second gas when a main power supply of said exposure apparatus is cut off.

8. An exposure apparatus according to claim 5, wherein partial gas conditioning which uses said second gas is performed in parallel with total gas conditioning which uses said first gas in said second room on exposure.

9. An exposure apparatus according to claim 8, wherein said second room has a path which guides said second gas to a specific area inside said second room.

10. An exposure apparatus according to claim 5, wherein said first room includes said first gas conditioning room and said second gas conditioning room, and said second room includes said third gas conditioning room and said fourth gas conditioning room.

11. An exposure apparatus according to claim 10, wherein said first gas conditioning room and said third gas conditioning room, said third gas conditioning room and said second gas conditioning room, and said second gas conditioning room and said fourth gas conditioning room are respectively divided by a sheet member.

12. An exposure apparatus according to claim 11, wherein said sheet member is a pressure resistant sheet which surface is at least, chemically processed.

13. An exposure apparatus according to claim 11, wherein said sheet member comprises metal leaf.

14. An exposure apparatus according to claim 11, wherein said main body of said exposure apparatus movably supports said substrate stage as well as support said projection optical system, said main body comprising:
- a first unit supported by a vibration isolation mechanism; and
- a second unit independent from the first unit in respect to vibration, said second unit supporting a driving unit of said substrate stage; and
- said sheet member is deformed in accordance with a relative positional change between said first unit and said second unit.

15. An exposure apparatus according to claim 14, wherein said first unit also movably supports said mask stage; and said second unit also supports a driving unit of said mask stage.

16. An exposure apparatus according to claim 14, wherein said sheet member is fastened to said each unit by a fastening mechanism, said fastening mechanism fastens said sheet member in a state where said sheet member is clamped between two members which surface roughness is below a predetermined level, and said fastening mechanism can be unfastened.

17. An exposure apparatus according to claim 10, wherein said second gas used to gas condition said third gas conditioning room and said fourth gas conditioning room is an inert gas with high purity level, and said first gas used to gas condition said first gas conditioning room and said second gas conditioning room is an inert gas which purity level is lower than said second gas.

18. An exposure apparatus according to claim 17, wherein said inert gas is helium gas.

19. An exposure apparatus according to claim 17, said exposure apparatus further comprising:
- a fifth gas conditioning room including said first to fourth gas conditioning rooms; and
- a third gas conditioning control unit which gas conditions said fifth gas conditioning room.

20. An exposure apparatus according to claim 19, said exposure apparatus further comprising:
- a first concentration sensor which individually detects concentration of said inert gas in a gas respectively used to gas condition said first to fourth gas conditioning rooms; and
- a first monitoring unit which monitors said concentration of said inert gas in said gas respectively used to gas condition said first to fourth gas conditioning rooms in accordance with an output of said first concentration sensor; wherein
    when said concentration of said inert gas of said gas used to gas condition at least one of said first and second gas conditioning rooms, which is a first specific gas conditioning room, is detected to have fallen below a predetermined concentration by said first monitoring unit, said first gas conditioning control unit freshly supplies said first gas to said first specific gas conditioning room, while exhausting said gas used to gas condition said first specific gas conditioning room to said third gas conditioning control unit so as to use said gas to gas condition said fifth gas conditioning room, and
    when said concentration of said inert gas of said gas used to gas condition at least one of said third and fourth gas conditioning rooms, which is a second specific gas conditioning room, is detected to have fallen below a predetermined concentration by said first monitoring unit, said second gas conditioning control unit freshly supplies said second gas to said second specific gas conditioning room, while exhausting said gas used to gas condition said second specific gas conditioning room to said third gas conditioning control unit so as to use said gas to gas condition said fifth gas conditioning room.

21. An exposure apparatus according to claim 20, wherein said first concentration sensor includes at least one of an impurities concentration sensor and an ozone sensor.

22. An exposure apparatus according to claim 20, said exposure apparatus further comprising:
- a storing mechanism which stores gas used for gas conditioning for recycling;
- a second concentration sensor which detects concentration of said inert gas in gas used to gas condition said fifth gas conditioning room; and
- a second monitoring unit which monitors said concentration of said inert gas in said gas used to gas condition said fifth gas conditioning room; wherein
    when said second monitoring unit detects that said concentration of said inert gas in said gas has fallen below a predetermined concentration, said third gas conditioning control unit exhausts said gas used to gas condition said fifth gas conditioning room into said storing mechanism.

23. An exposure apparatus according to claim 22, wherein said second concentration sensor includes at least one of an impurities concentration sensor and an ozone sensor.

24. A device manufacturing method including a lithographic process, wherein exposure is performed, by using said exposure apparatus according to claim 1 in said lithographic process.

25. An exposure method to perform exposure on a substrate with illumination light from a light source, said exposure method comprising;
- providing a first gas to a first space which is arranged on an optical path between said light source and said substrate, said space having a first optical path length and a predetermined level of chemical cleanliness degree;
- providing a second gas to a second space which has a second optical path length longer than said first optical path length and has a higher degree of chemical cleanliness compared with said first space; and
- performing exposure on said substrate with said illumination light from said light source after said first space is filled with said first gas and said second space is filled with said second gas.

26. An exposure method according to claim 25, wherein said second gas is an inert gas with high purity level, and said first gas is an inert gas which purity level is lower than said second gas.

27. An exposure method according to claim 26, wherein a third space houses said first space and said second space, and a third gas is supplied to said third space.

28. An exposure method according to claim 27, wherein said third gas is an inert gas which purity level is lower than that of said first gas.

29. An exposure method according to claim 28, wherein
- a stage which holds said substrate is housed in said first space, and
- an optical system to perform exposure on said substrate with said illumination light is housed in said second space.

30. An exposure apparatus according to claim 1, wherein gas conditioning performed by said first gas conditioning control unit includes one of removing an absorptive gas concentrated in said first gas which absorbs said exposure light and controlling temperature and gas flow of said first gas, and gas conditioning performed by said second gas conditioning control unit includes one of removing an absorptive gas concentrated in said second gas which absorbs said exposure light and controlling temperature and gas flow of said second gas.

31. An exposure apparatus that exposes a substrate with an illumination light from a light source, said exposure apparatus comprising:

at least a first chamber arranged on an optical path between said light source and said substrate, said first chamber having a first optical path length and a predetermined level of chemical cleanliness degree;

at least a second chamber arranged on said optical path, said second chamber having a second optical path length longer than said first optical path length and having a higher degree of chemical cleanliness compared with said first chamber;

a first gas supply unit that is provided with said first chamber and supplies a first gas into said first chamber; and a second gas supply unit that is provided with said second chamber and supplies a second gas into said second chamber.

32. An exposure apparatus according to claim 31, wherein said second gas is an inert gas with high purity level, and said first gas is an inert gas which purity level is lower than said second gas.

33. An exposure apparatus according to claim 31, said exposure apparatus comprising:

a main body of said exposure apparatus, said main body including an illumination optical system arranged on said optical path which illuminates said mask with said illumination light, and a projection optical system arranged on said optical path which projects said illumination light outgoing from said mask on said substrate, wherein said first chamber includes one of the space in between said illumination optical system and said projection optical system and the space in between said projection optical system and said substrate.

34. An exposure apparatus according to claim 33, wherein said main body of said exposure apparatus further includes a mask stage which holds said mask and a substrate stage which holds said substrate, and said first chamber includes one of said mask stage and said substrate stage.

35. An exposure apparatus according to claim 33, wherein said second chamber includes one of an optical space within said projection optical system and an optical space within said illumination optical system.

36. An exposure apparatus according to claim 31, wherein said exposure apparatus has a sheet member which surface is at least, chemically processed, said sheet member dividing said first chamber and said second chamber.

37. An exposure apparatus according to claim 36, wherein said sheet member comprises metal leaf.

* * * * *